United States Patent [19]

Oshida et al.

[11] Patent Number: 4,668,089

[45] Date of Patent: May 26, 1987

[54] EXPOSURE APPARATUS AND METHOD OF ALIGNING EXPOSURE MASK WITH WORKPIECE

[75] Inventors: Yoshitada Oshida, Fujisawa; Masataka Shiba, Yokohama; Toshihiko Nakata, Yokohama; Mitsuyoshi Koizumi, Yokohama; Naoto Nakashima, Yokohama, all of Japan

[73] Assignee: Hitachi, Ltd., Tokyo, Japan

[21] Appl. No.: 684,292

[22] Filed: Dec. 20, 1984

[30] Foreign Application Priority Data

Dec. 26, 1983 [JP] Japan ............................ 58-243866
Oct. 24, 1984 [JP] Japan ............................ 59-222010

[51] Int. Cl.$^4$ .......................... G01B 11/26; G01J 1/32
[52] U.S. Cl. .................................... 356/152; 250/202
[58] Field of Search ............... 356/152; 250/202, 571, 250/548

[56] References Cited

U.S. PATENT DOCUMENTS

| | | | |
|---|---|---|---|
| 3,989,385 | 11/1976 | Dill et al. | 356/152 |
| 4,090,068 | 5/1978 | Widmann et al. | 356/152 X |
| 4,103,998 | 8/1978 | Nakazawa et al. | 356/152 |
| 4,269,505 | 5/1981 | Mayer | 356/152 X |
| 4,353,087 | 10/1982 | Berry et al. | 356/152 X |
| 4,357,100 | 11/1982 | Mayer et al. | 356/152 X |
| 4,496,241 | 1/1985 | Mayer | 356/152 |

*Primary Examiner*—Stephen C. Buczinski
*Assistant Examiner*—Linda J. Wallace
*Attorney, Agent, or Firm*—Antonelli, Terry & Wands

[57] ABSTRACT

An exposure apparatus comprises a light source, a mask plate having an exposure pattern area section and an alignment/reflection area section, a projection lens, a movable stage for holding a workpiece having a workpiece alignment mark, an alignment control and a driver for the movable stage. Before the exposure pattern area section is illuminated by the light source to be projected through the projection lens onto the workpiece, the workpiece is properly aligned with the mask. Alignment between the mask plate and the workpiece is performed by the effective use of the alignment/reflection area section specifically arranged and having a specific structure. The alignment/reflection area section is on that surface of the mask plate which does not face the light source and includes a reflection portion for conducting light from another light source to the workpiece and conducting light scattered from the workpiece and passing through the projection lens to the alignment control and a mask alignment mark portion of providing, when illuminated, an image of the mask alignment mark portion to the alignment control so that it detects the positional relation between the mask alignment mark portion and the workpiece alignment mark and produces a control signal for achieving alignment between the mask plate and the workpiece.

22 Claims, 59 Drawing Figures

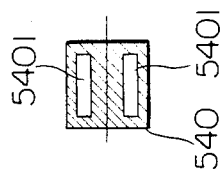
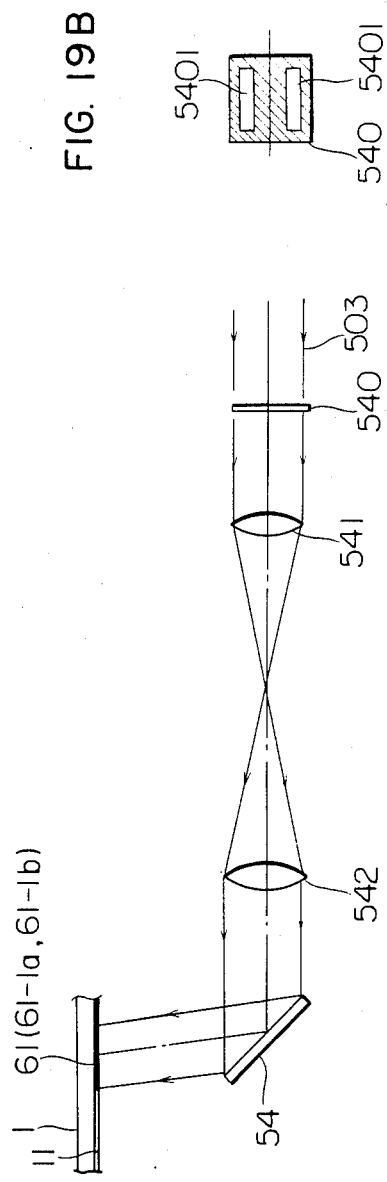
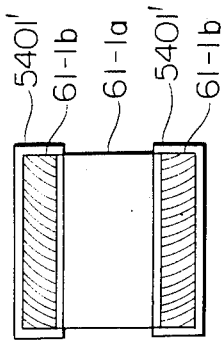

FIG. 24
FIG. 25
FIG. 26A
FIG. 26B
$$O_\Sigma(i) = \int_{t_0}^{t_N} O(t,i)dt$$
FIG. 26C
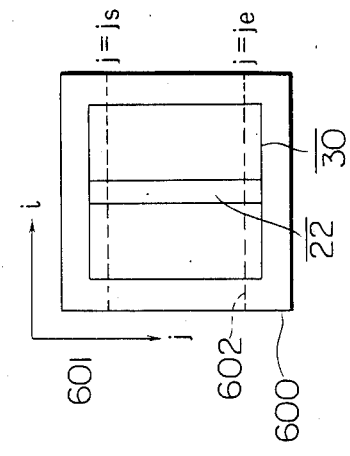
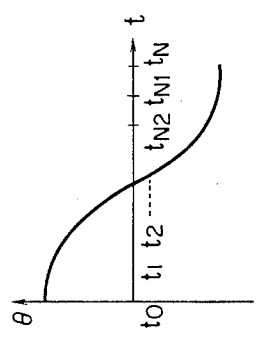
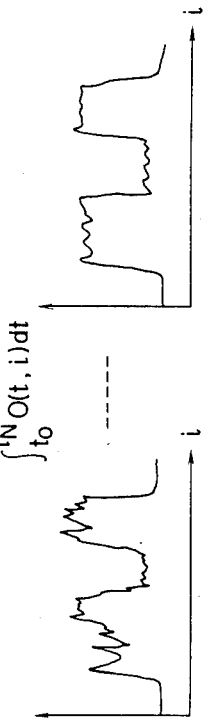

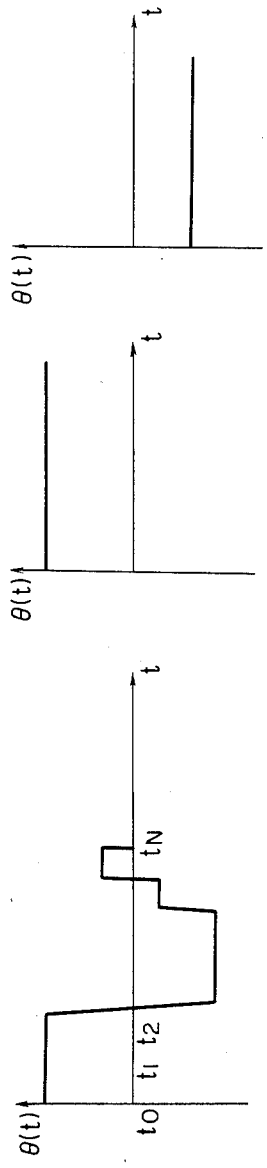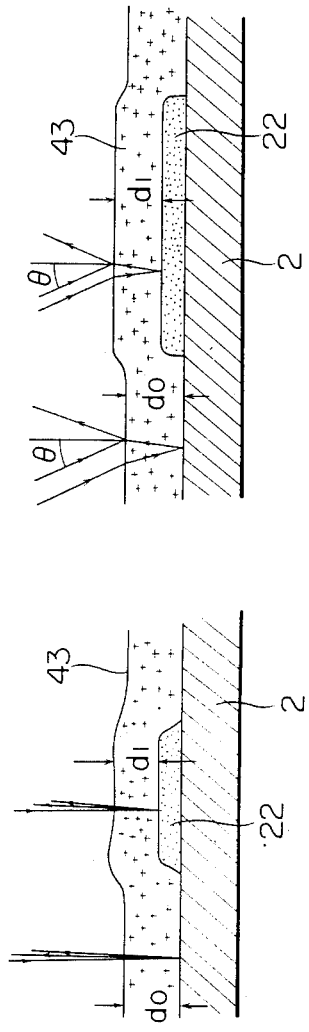

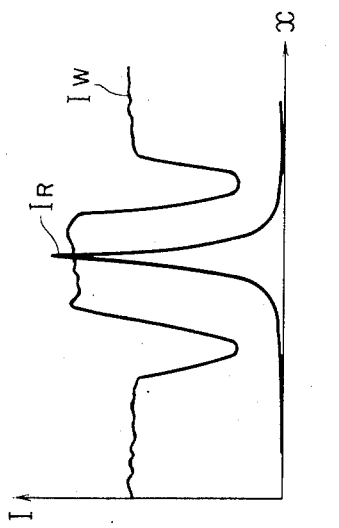
FIG. 29
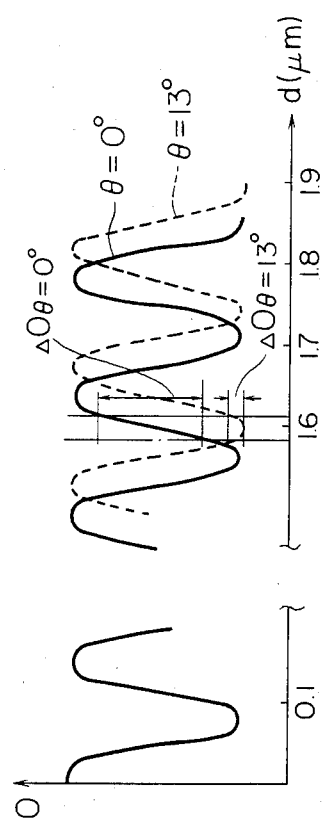
FIG. 30A
FIG. 30B
FIG. 30C
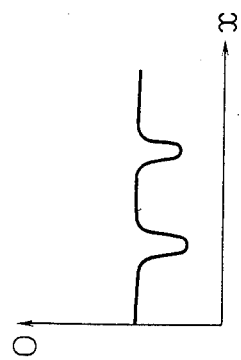
FIG. 31

EXPOSURE APPARATUS AND METHOD OF ALIGNING EXPOSURE MASK WITH WORKPIECE

A circuit pattern of a semiconductor device has been further miniatuarized year by year and a requirement for a precision for alignment of the pattern is becoming more and more severe. When the alignment precision is 0.3 μm or larger, a wafer alignment method or a global alignment method has been used. In this method, positions at several points on a periphery of a wafer chip are measured by an alignment optical system and a laser distance measurement device and chip exposure positions are calculated on a presumption that other chips are accurately aligned and the wafer is exposed by a step and repeat method. In this method, since only several positions on the chip need be measured, an alignment detection time is short, an exposure time to an entire area of the wafer is short and a throughput is high. However, in this method, because of the presumption of the alignment of the chips, a high alignment precision is not attained and a specification required in a future alignment is hardly met. Accordingly, it is necessary in future to align chip by chip.

A prior art chip-by-chip alignment method is shown in FIG. 1. When a circuit pattern of a mask or reticle 1 is to be overexposed on a chip (or circuit pattern) 21 on a workpiece 2 such as a wafer, if alignment target marks 22A and 22A' are arranged adjacent to the circuit pattern 21 on the wafer, a mirror 560' of alignment detection optical systems 500 and 560' for detecting the target marks must be penetrated into an exposure light flux 41. In order to avoid this, the mirror must be arranged outside of the exposure light flux as shown by 560. In this arrangement, since images of the wafer target marks 22A and 22A' through a reduction lens 3 do not fall into a view field of the alignment detection optical system, the wafer 2 is to be sequentially moved to positions 21' and 21''. A distance of movement is measured by a laser distance measurement device, the target position is measured by the alignment detection optical system, an alignment position of the reticle and the wafer circuit pattern is calculated based on those measurements and the wafer is moved to that position and overexposure is effected at that position. Such an extra wafer movement step leads to reduction of the alignment precision and the throughput. Numerals 12 and 12' denote alignment target marks on the reticle. In order to avoid such an extra step, the wafer circuit pattern 21 and the target marks 22 and 22' may be arranged at positions corresponding to the circuit pattern 11 of the reticle and the target marks 12 and 12' of FIG. 1 as shown in FIG. 2 so that the alignment is attained at the exposure position. In this method, however, since a distance from the circuit pattern 21 and the wafer target mark 22' must be larger than a predetermined length (1 mm), a width $W_S$ of an area (scribe area) between adjacent circuit patterns (chips) increases and a yield of the chip decreases and dusts are generated in a cutting step of the chips.

FIG. 3 shows another prior art exposure position detection measure similar to that disclosed in U.S. Pat. No. 4,357,100 issued on Nov. 2, 1982. A protection glass 120 is mounted on a pattern surface 110 of a mask (reticle) 1, a light reflected by a target pattern 22 of a wafer 2 and transmitted through a reduction lens 3 is reflected by the protection glass 120 and further transmitted through a light splitting layer 16, and focused, together with an optical image of the alignment target pattern 12, on a predetermined focusing plane through an enlarging/focusing lens 3', as shown more clearly in the left-hand portion of FIG. 3 representing an enlargement of the encircled part in the right-hand portion of FIG. 3. In this prior art method, wavelengths of the exposure light and the alignment light are different from each other and an axial chromatic aberration due to the wavelength difference is compensated by fold-back of light by the protection glass and the light splitting layer. By this arrangement, alignment at the exposure position is attained. However, this method involves the following problems. (1) Since the axial chromatic aberration Δl (Δl=3–10 mm) is not large enough to facilitate mounting of the optical system, a spacing between the protection glass and the light splitting layer is approximately Δl/2 which makes the mounting of the detection optical system difficult. (2) In this method, the light from the wafer target mark is reflected by the protection glass mounted on the lower surface of the reticle. However, such a protection glass is not protected from dusts and a pellicle layer (which is a high molecule layer having a thickness of several microns and which does not influence an imaging characteristic of the reduction lens) is placed on the reticle with a spacing of 6–10 mm therefrom. The larger the spacing from the reticle surface is, the less is the influence by the dusts. However, if the protection glass has a thickness corresponding to such a spacing, the imaging characteristic of the reduction lens is influenced so that a resolution power is lowered.

On the other hand, a device as shown in FIG. 4A is commercially available. In this device, however, since an end of a detection system interrupts an exposure light from a circuit pattern A as shown in FIG. 4B, an image of a pattern is scratched off if it is to be imaged in a vicinity of a wafer target. Accordingly, the pattern cannot be imaged in the vicinity of the target and only an area inside of a pattern B can be exposed as the circuit pattern.

It is an object of the present invention to provide a high throughput exposure apparatus.

It is another object of the present invention to provide an exposure apparatus having a high alignment precision.

It is another object of the present invention to provide a method for aligning an exposure mask with a workpiece with a high precision in an exposure apparatus.

In accordance with one aspect of the present invention, the exposure apparatus comprises an exposure light source, mask plate means having an exposure pattern area section and an alignment/reflection area section adjacent thereto, movable stage means for holding a photosensitive workpiece having a workpiece alignment mark, projection lens means interposed between the mask plate means and the movable stage means and disposed across the mask plate means from the exposure light source, alignment means for detecting the positional relation between the mask plate means and the workpiece to produce a control signal for aligning the mask plate means with the workpiece, and drive means for driving the movable stage means in accordance with the control signal. The alignment/reflection area section is disposed on that surface of the mask plate means which does not face the exposure light source. The scattered or reflected light from the workpiece alignment mark illuminated by the alignment light source is transmitted through the projection lens. The alignment/reflection area section includes a reflection portion which reflects the light transmitted through the projection lens to provide a reflected image of the workpiece alignment mark and a mask alignment mark portion for providing an image representative of the mask plate means. Based on the detected positional relation between those images, the control signal necessary to align the mask plate means (mask alignment mark portion) with the workpiece (workpiece alignment mark) is generated.

In accordance with another aspect of the present invention, a method for aligning an exposure mask with a workpiece in an exposure apparatus in which the exposure mask is illuminated by an exposure light source to project images of patterns contained in an exposure pattern area section of the exposure mask through projection lens means onto the workpiece held on a movable stage and having a workpiece alignment mark, the method comprising the steps of:

arranging an alignment/reflection area section adjacent to the exposure pattern area section on that surface of the exposure mask plate which does not face the exposure light source means, the alignment/reflection area section including a reflective portion and an alignment mark portion;

illuminating the workpiece alignment mark with alignment light source means so that scattered or reflected light from the workpiece alignment mark passes through the projection lens means and is reflected at the reflection portion of the alignment/reflection area section;

detecting the positional relation between the alignment mark portion and the workpiece alignment mark and producing a control signal representative of misregistration between the alignment mark portion and the workpiece alignment mark based on the detected positional relation; and adjusting the relative position between the exposure mask and the workpiece in accordance with the control signal.

In the accompanying drawings:

FIGS. 17A to 17C and 18 illustrate an operation of the apparatus of FIG. 5A when the alignment/reflection area section of FIG. 16 is used;

FIGS. 19A to 19C show an improvement of the alignment/reflection area section of FIG. 16;

FIG. 24 shows a mode of change of the incident angle of the alignment light to the wafer alignment mark;

FIGS. 25 and 26A to 26C illustrate detection of alignment mark images in the apparatus of FIGS. 20A and 20B;

FIGS. 27A to 27C show another mode of change of the incident angle of the alignment light to the wafer alignment mark;

FIGS. 28A and 28B illustrate multiple interference of alignment light caused by lamination of the wafer, alignment mark and resist layer;

FIG. 29 shows a relation between a resist layer thickness and the multiple interference, with the incident angle of the alignment light being a parameter;

FIGS. 30A to 30C show signal waveforms when the alignment mark is detected in an ideal manner;

FIG. 31 shows waveforms of detection signals for the alignment mark image in the apparatus of FIG. 20A.

Figure 1:
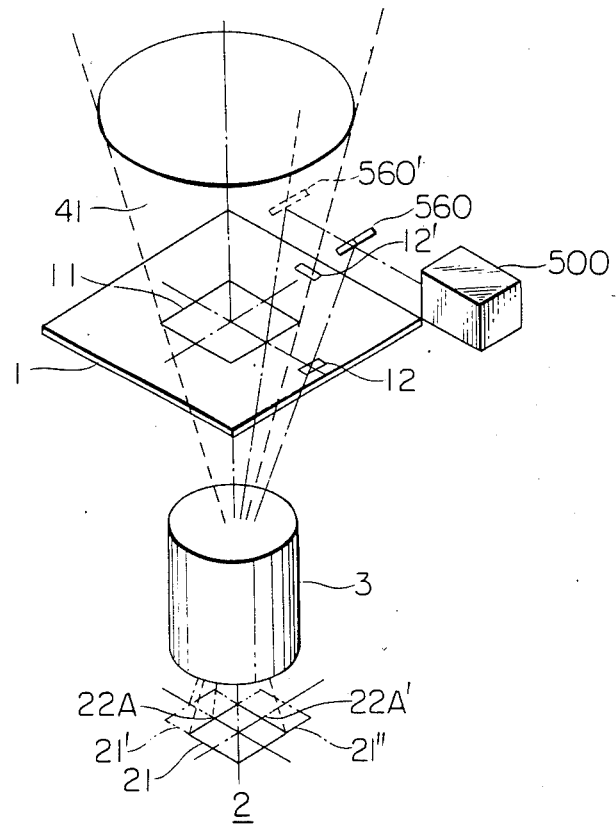
FIGS. 1 to 3, 4A and 4B show prior art exposure apparatus and alignment methods.
Figure 2:
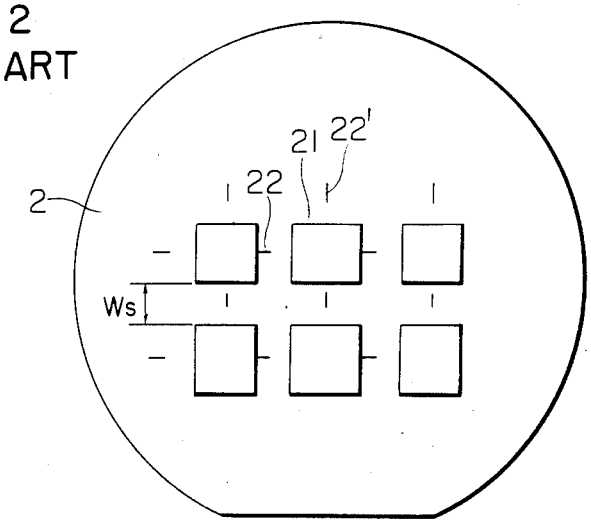
Figure 3:
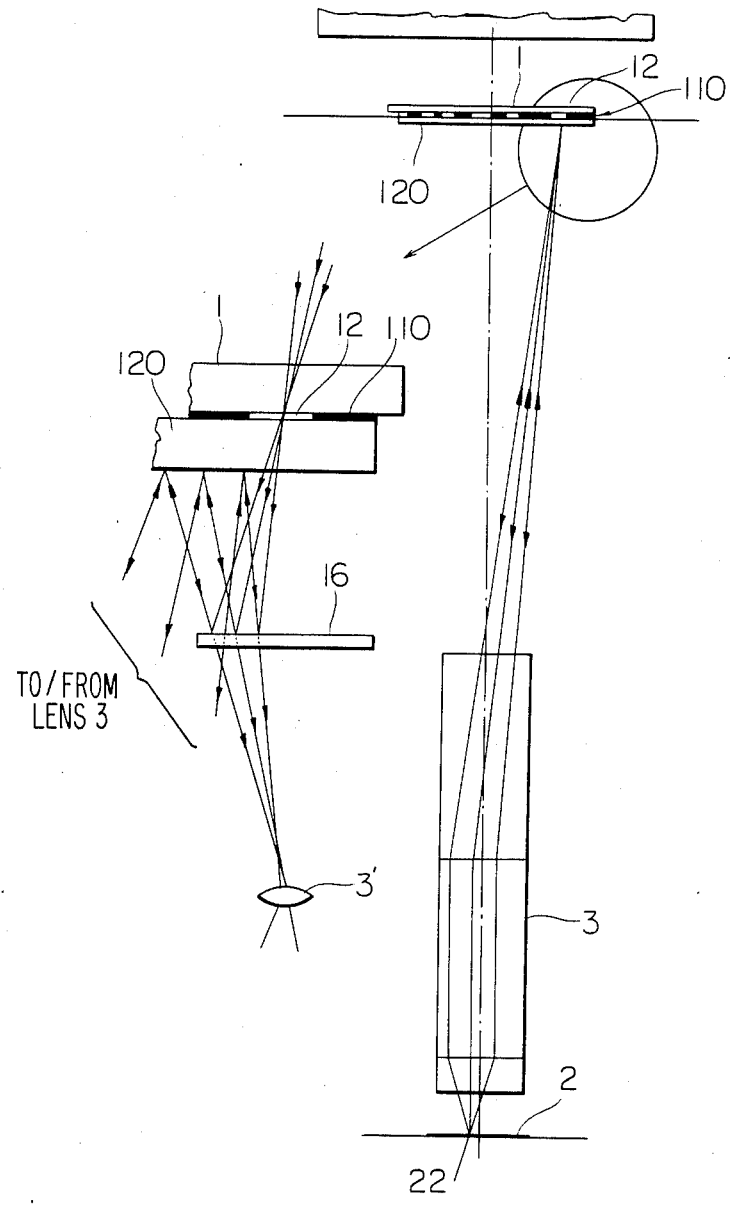
Figure 4A:
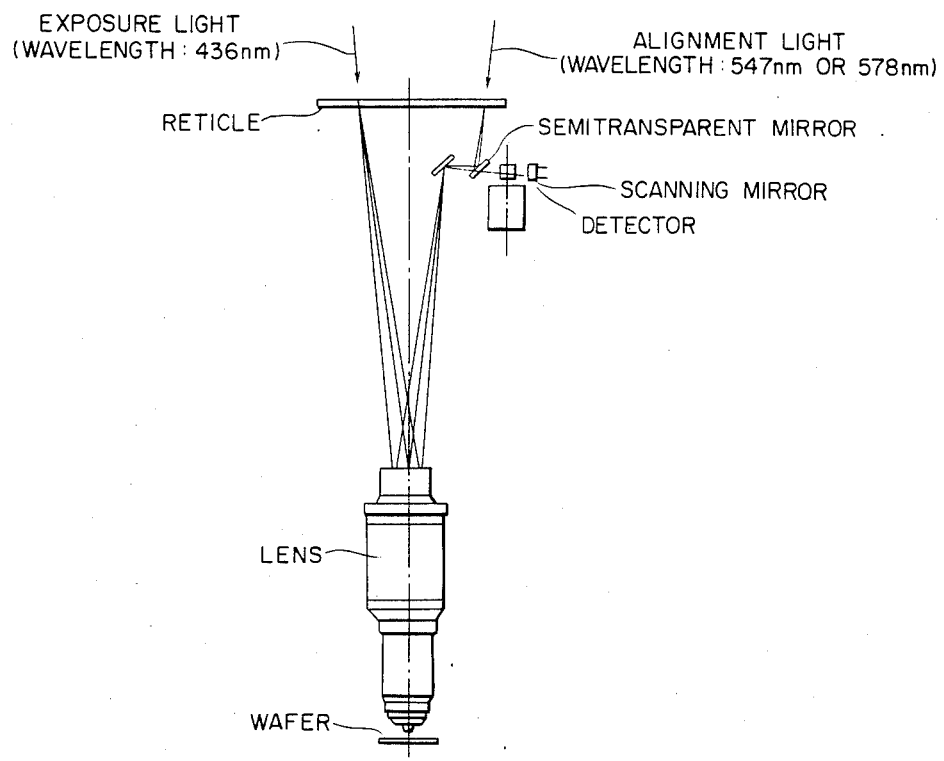
Figure 4B:
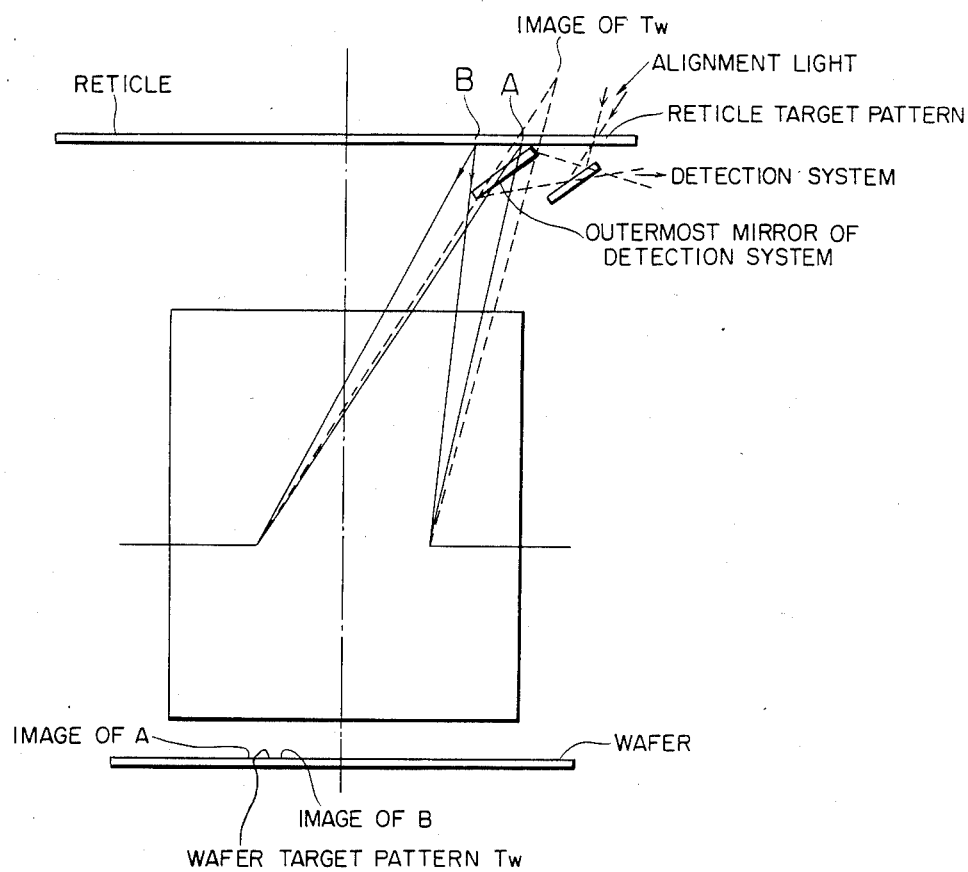
Figure 5A:
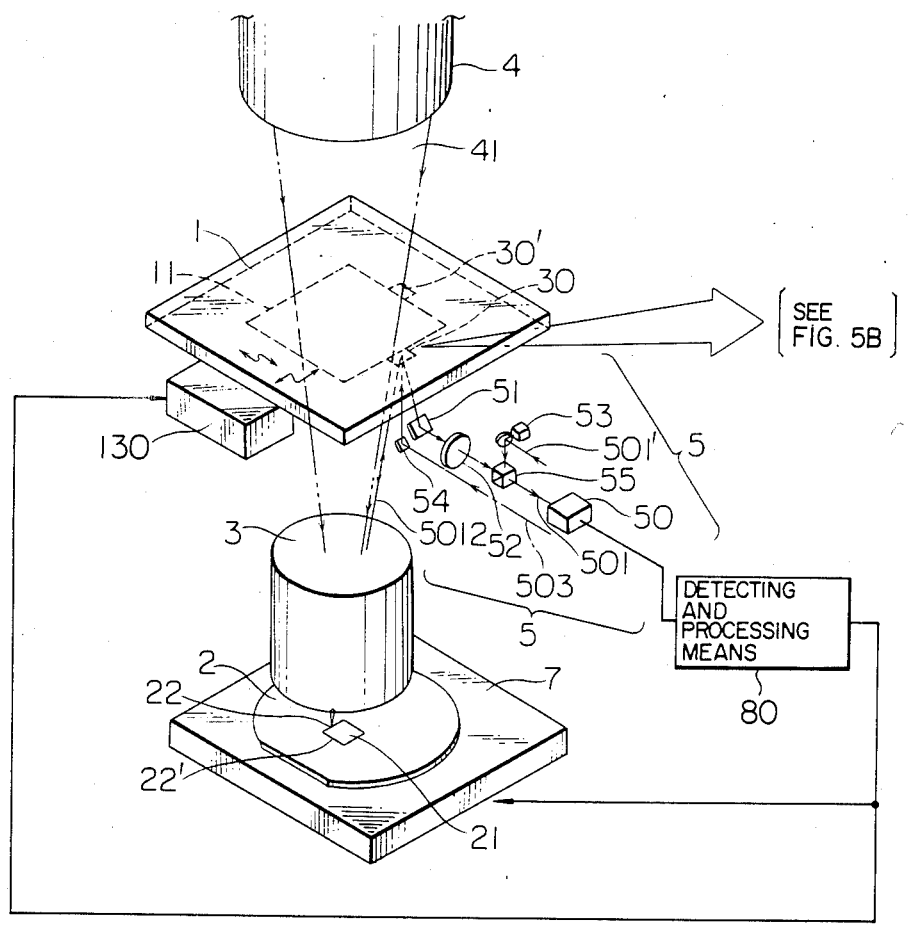
FIGS. 5A to 5C show an exposure apparatus and an alignment method in accordance with one embodiment of the present invention in which an exposure light and an alignment light have substantially the same wavelength.
Figure 5B:
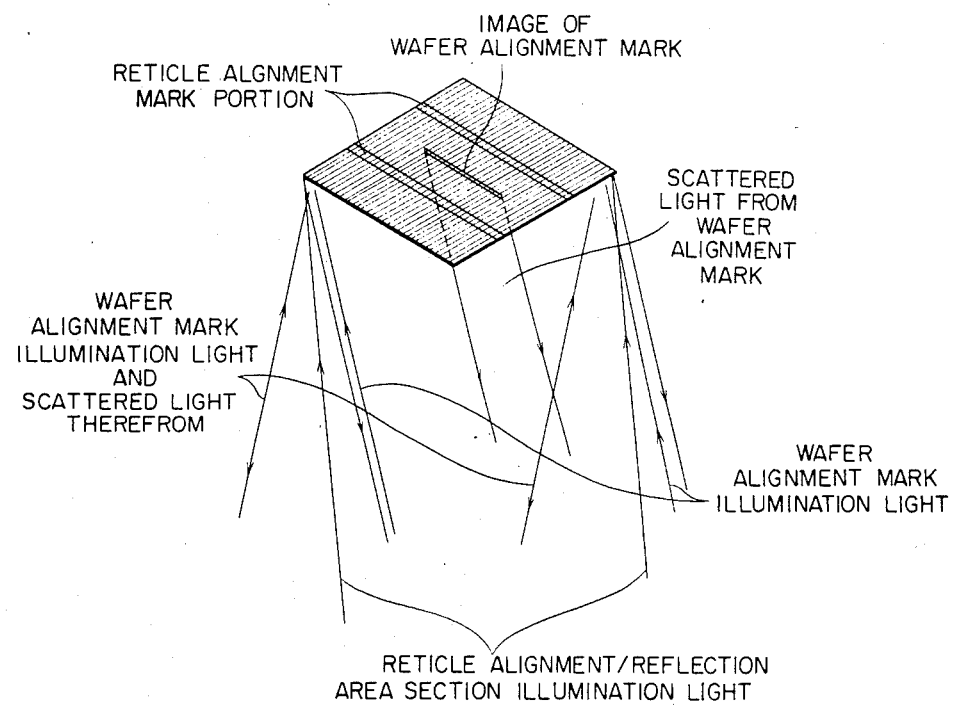
Figure 5C:
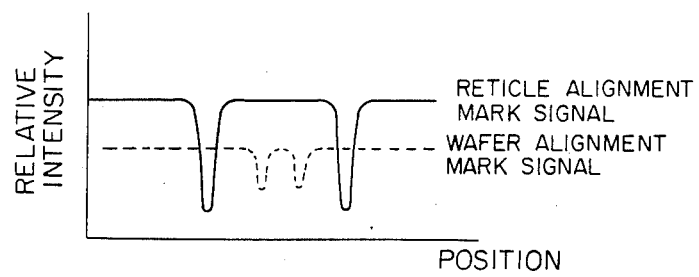

Referring to FIGS. 5A to 5C which show one embodiment in which the alignment is achieved by using an exposure light and an alignment light of the same wavelength, an exposure apparatus includes an exposure light source 4, a reticle (mask plate means) 1, a projection lens, e.g., a reduction lens 3, a movable stage 7 for holding a photosensitive wafer (workpiece) 2 having alignment marks (wafer alignment marks) 22 and 22' and means (not shown) for driving the movable stage 7. The reticle 1 includes an exposure pattern area section including an area 11 and alignment/reflection area section including areas 30 and 30' arranged adjacent thereto. Before the exposure pattern area 11 is illuminated by the light source 4 and an image thereof is projected on a chip 21 of a wafer 2 through the reduction lens 3, the alignment of the reticle 1 and the wafer 2 is carried out.

The alignment/reflection areas 30 and 30' are arranged on that surface of the reticle 1 which does not face the light source 4 and each of the alignment/reflection areas 30 and 30' has a reflection portion and a mask alignment mark portion. Since the areas 30 and 30' are identical in construction and arrangement, only the area 30 is explained below. The reflection portion of the area 30 serves as a mirror when an alignment illumination light 501' is projected to the wafer alignment mark 22 adjacent to the chip 21 of the wafer 2 through a semi-transparent mirror 55, an enlarging/focussing lens 52 and a mirror 51 and also serves to reflect scattered or reflected light transmitted through the reduction lens 3 from the wafer target mark and direct it to an alignment detection unit 5 disposed out of an exposure light path. The reflection portion has a grating and a O-th order light (regular reflection light) is used to illuminate the wafer alignment mark and detect its image. As shown in FIG. 5B, elongated reticle target patterns (Cr or $Cr_2O_3$ patterns or clear patterns) are recorded on the area 30 in a transverse direction to the grating to form the mask alignment mark portion. The wafer alignment mark illumination light 501' is regularly reflected by the reflection portion and directed to a center of entrance pupil of the reduction lens 3. When the incident light 501' to the wafer alignment marks 22 and 22' is swung by a Galvanomirror 53' it is swung such that the illumination light falls within the entrance pupil circle. The scattered (reflection) light from the wafer alignment mark is focussed onto the alignment/reflection area 30, and after it is regularly reflected, the image is refocused onto a detection element unit (imaging element unit) 50 so that a signal shown by a broken line in FIG. 5C is produced. On the other hand, the reticle alignment mask portion is illuminated by a reticle target illumination light 503 of another light path through the mirror 54. The incident angle of the illumination light to the alignment/reflection area 30 is different from that of the wafer illumination light and a direction of diffraction of the light primarily diffracted by the reflection portion corresponds to the direction of the light from the wafer alignment mark 22. Since there is no grating in the reticle alignment mark, a signal shown by a solid line in FIG. 5C is produced by the detection element unit 50. In order to distinguish those signal patterns, the light paths are sequentially switched so that the patterns are detected independently. The detected signals are fed to the detecting and processing means 80, in which centers of the waveforms of the detected signals are determined by known measures such as symmetrical pattern matching technique, information on the locations of the waveform centers are once stored in a memory at particular addresses and the positional deviation between the detected signals is determined from the address information. (See, for example, U.S. Pat. No. 4,115,762 or Japanese Patent Publication No. 2284/81.) A control signal is then produced on the basis of the determined positional deviation and is used to drive the movable stage 7 or a reticle fine adjusting mechanism 130 so that a high precision alignment is attained. For the generation of the control signal, reference may be made to U.S. Pat. No. 4,153,371 or U.S. Pat. No. 4,362,389.

Figure 6A:
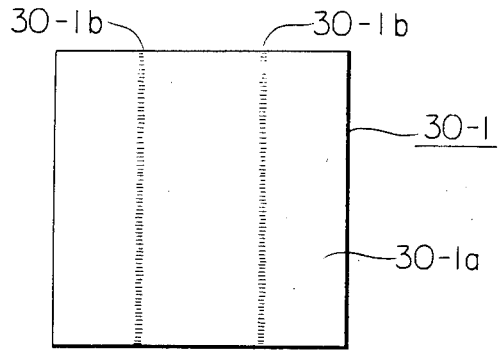
FIGS. 6A, 6B, 7A, 7B, 8A and 8B show arrangements of an alignment/reflection area sections which may be used in the apparatus of FIG. 5 and signal waveforms representing a mask alignment mark image and a wafer alignment mark image.
Figure 6B:
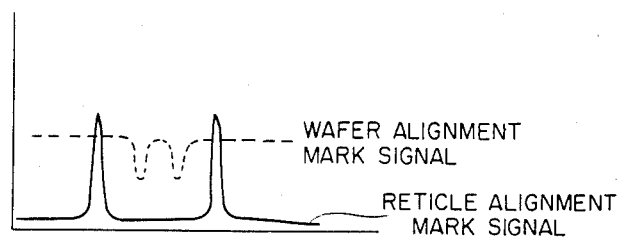

FIGS. 6A and 6B show another arrangement 30-1 of the alignment/reflection area section in the embodiment of the present invention in which the exposure light and the alignment light have substantially the same wavelength, and it is used as the area section 30 of the reticle shown in FIG. 5A. The reflection portion 30-1a is mostly coated with Cr or $Cr_2O_3$ except a reticle alignment pattern portion 30-1b which has a grating. When the same detection unit as that in FIG. 5A is used, the detection element unit 50 produces a signal as shown in FIG. 6B. In this case, the reticle alignment mark signal is high only for the grated target area.

Figure 7A:
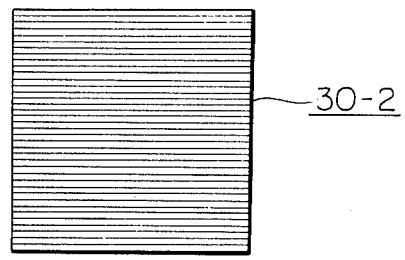
Figure 7B:
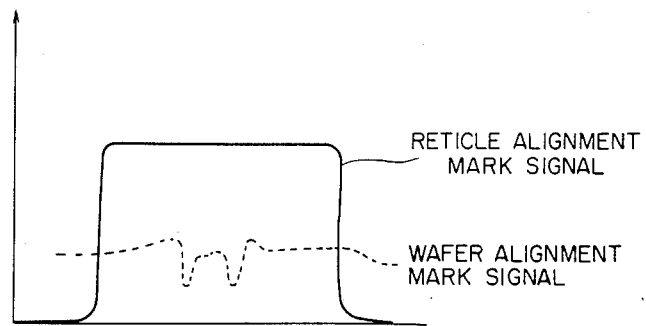

FIGS. 7A and 7B show another arrangement 30-2 of the alignment/reflection area section in the embodiment of the present invention in which the exposure light and the alignment light have substantially the same wavelength. In FIG. 7A, the reflection portion on the reticle has a uniform grating and left and right areas thereof are clear. Again, the same detection unit as that of FIG. 5A may be used. In the present embodiment, a reticle signal and a wafer signal as shown in FIG. 7B are produced.

Figure 8A:
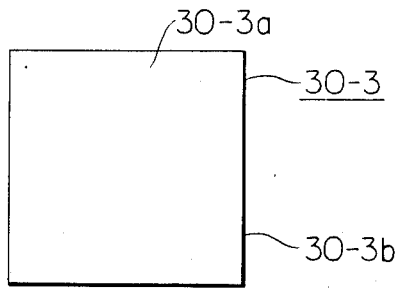
Figure 8B:
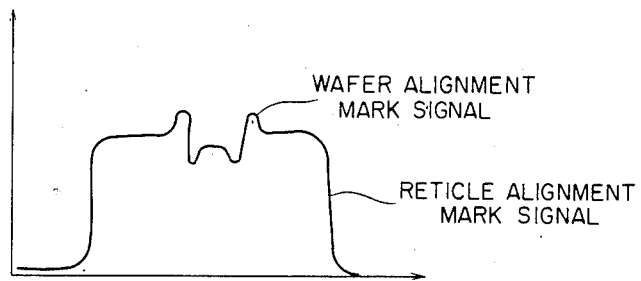

FIGS. 8A and 8B show another arrangement 30-3 of the alignment/reflection area section in the embodiment of the present invention in which the exposure light and the alignment light have substantially the same wavelength. A reflection portion 30-3a on the reticle is a uniform Cr or $Cr_2O_3$ surface. The reticle alignment mark detection illumination light 503 (and the mirror 54) shown in FIG. 5A should not be used and the wafer illumination light is also used to illuminate the reticle. An outline or contour 30-3b of the reflection portion 30-3a forms the reticle alignment mark portion, and a signal as shown in FIG. 8B is produced. With this arrangement of the alignment/reflection area section, the alignment mark signals of the wafer and the reticle are simultaneously detected, unlike the embodiments shown in FIGS. 5A, 6A and 7A.

In the above embodiments, the wafer alignment mark illumination light is directed to the wafer alignment mark through the reduction lens. Alternatively, the light may be obliquely directed to the wafer alignment mark from the above of the wafer without passing through the reduction lens, provided that the scattered light from the wafer alignment mark is detected through the reduction lens.

As an LSI circuit pattern is more and more miniaturized and a pattern width is reduced to approximately 1 $\mu$m, it is difficult to keep variation of the pattern width within ±10%. When a resist layer is coated on an underlying layer having a high reflection coefficient such as an Al pattern and a pattern is exposed on such a resist layer, an interference fringe (standing wave) having a high contrast is produced in parallel to the resist layer by a reflection light from the underlying layer and the incident light. If the resist exposed under this condition is developed, fine unevenness is produced in a section of the resist layer. Thus, it is difficult to reduce the variation of the pattern width. In recent years, when a fine pattern is to be formed on an aluminum underlying layer, a light-absorbing resist is used to prevent the reflection from the aluminum surface. When such a light-absorbing resist is used, it is difficult to align the exposure mask by using the alignment detection light having the equal or nearly equal wavelength to that of the exposure light because no substantial reflection light from a step of the wafer alignment mark is obtained. In this case, it is necessary to use the alignment illumination light having a wavelength which is longer than the wavelength of the exposure light and which transmits the light to the light-absorbing resist.

An embodiment in which the alignment is achieved by the alignment light having a different wavelength from that of the exposure wavelength is now explained.

In this embodiment, when the exposure pattern area section on the mask is to be projected onto the wafer, the alignment/reflection area section including a focusing pattern is arranged in adjacent to the exposure pattern area section as will be explained later, and the focusing pattern is illuminated by an essentially monochromatic light. The monochromatic light used need not be a physically pure monochromatic light but a light which can be practically considered as monochromatic may be sufficient for the present purpose. A wavelength of the monochromatic light is longer than the wavelength of the ordinary exposure light. The light reflected from the focusing pattern illuminated by the monochromatic light is diffracted and forms a condensed image. The condensed image is used as the mask alignment mark image. On the other hand, the image of the alignment mark on the chip of the wafer is focused in the vicinity of the mask alignment mark by the exposure or projection lens as will be explained later. Thus, based on those condensed images and the alignment image of the chip, the accurate alignment is attained.

Figure 9:
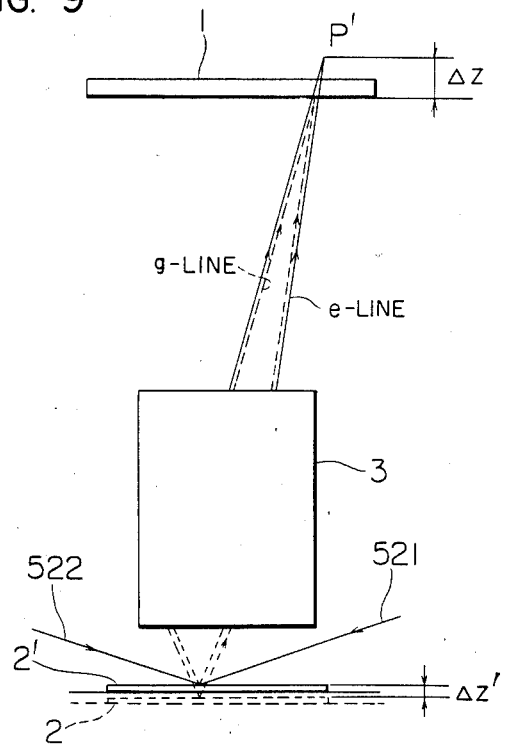
FIG. 9 shows images foussed by a projection lens for the exposure light and the alignment light having a different wavelength from that of the exposure light.

FIG. 9 shows a relation between image formation at the exposure wavelength of a focusing lens 3 of a semiconductor exposure apparatus and image formation at the alignment wavelength. When a wafer is at a position 2', a point P of a reticle 1 is sharply formed on the wafer by the exposure light (g-line) or dotted line light. However, where the alignment lights 521 and 522 (e-line) are obliquely directed to the wafer alignment mark for aligning the wafer and the wafer is at the position 2', the wafer alignment mark image is formed by the focusing lens 3 at a position P' which is displaced from the position P by $\Delta z$. In order to resolve this problem, it has been required to lower the level of the wafer from the position 2' to the position 2 by $\Delta z'$ to form the pattern of the wafer near the point A on the mask. The distances $\Delta z$ and $\Delta z'$ meet a relation of $\Delta z = N^2 \Delta z'$ where N is a magnification of the lens, and $\Delta z'$ is approximately 200 $\mu$m and $\Delta z$ is 20 mm when N=10. If the wafer must be moved up and down by 200 $\mu$m for each exposure, the total exposure time for the wafer will be further increased.

Figure 10A:
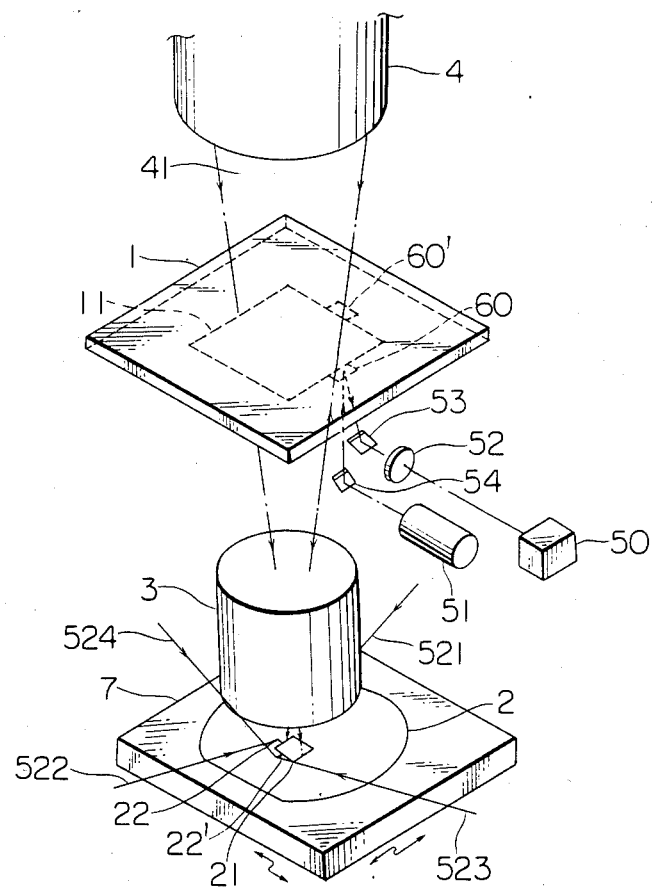
FIGS. 10A and 10B show an exposure apparatus and an alignment method in accordance with another embodiment of the present invention in which the exposure light and the alignment light have different wavelengths.
Figure 10:
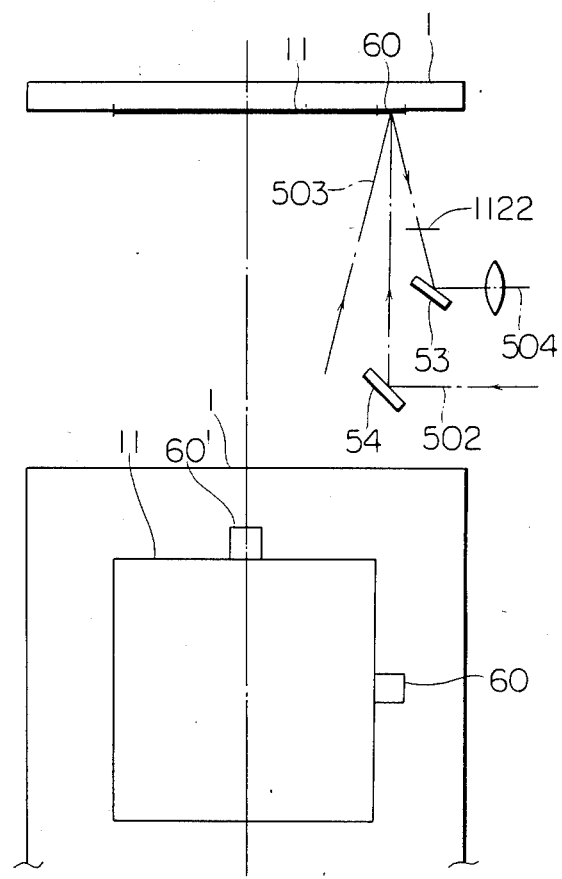
Figure 11B:
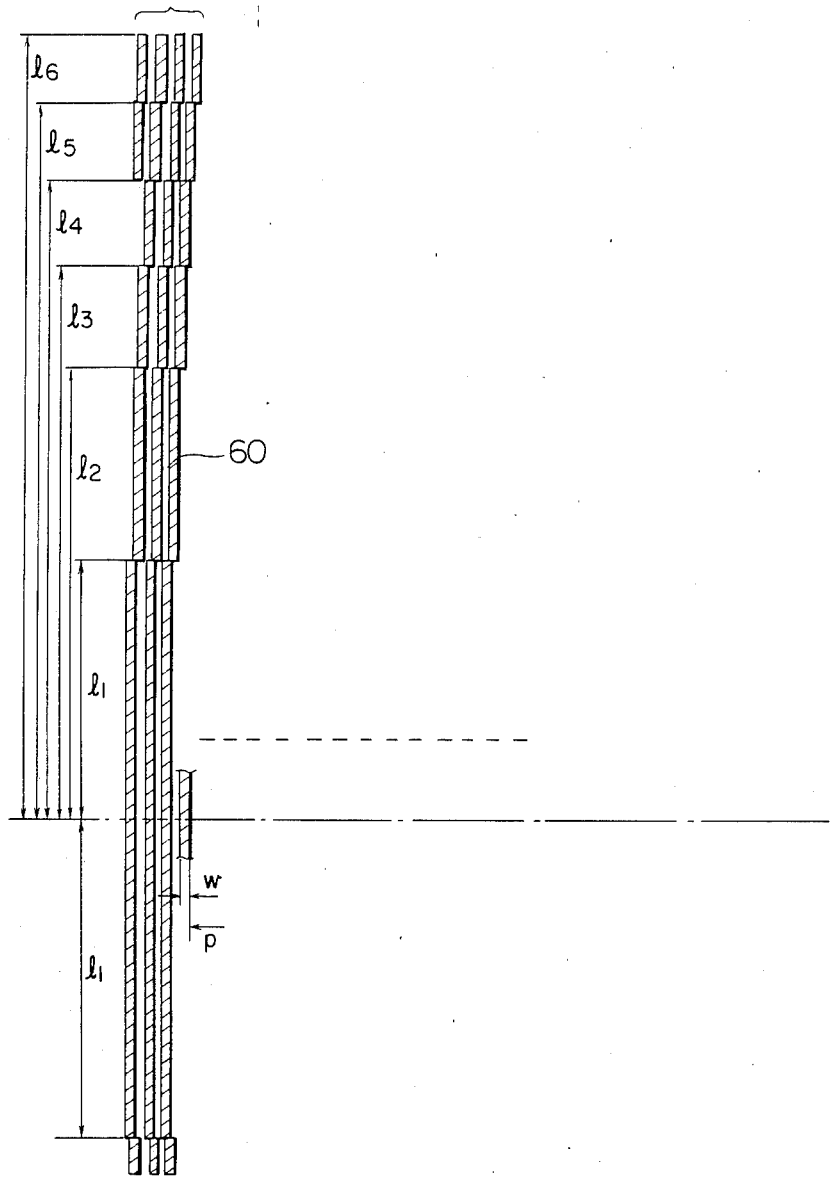
Figure 12A:
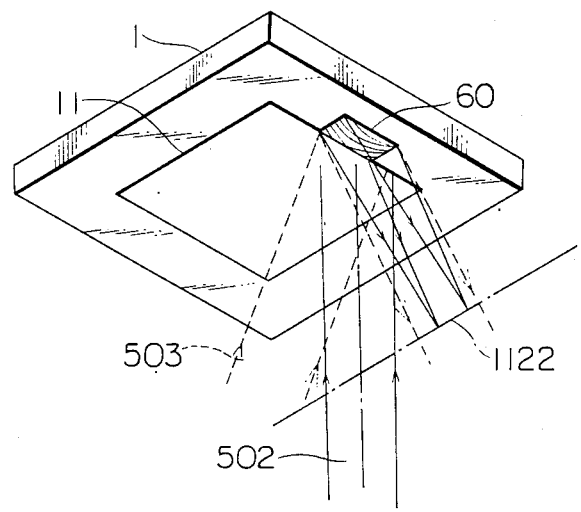
FIGS. 12A to 12C and 13 illustrate alignment in the apparatus of FIG. 10A.
Figure 12B:
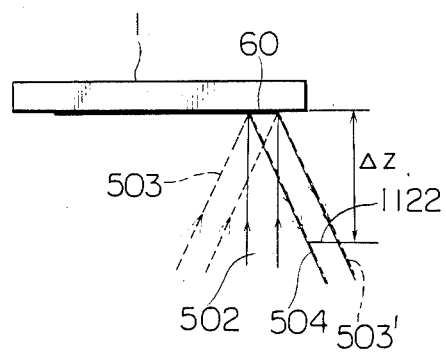
Figure 12C:
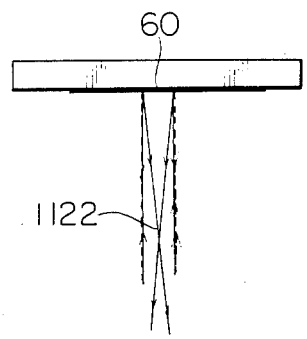
Figure 13:
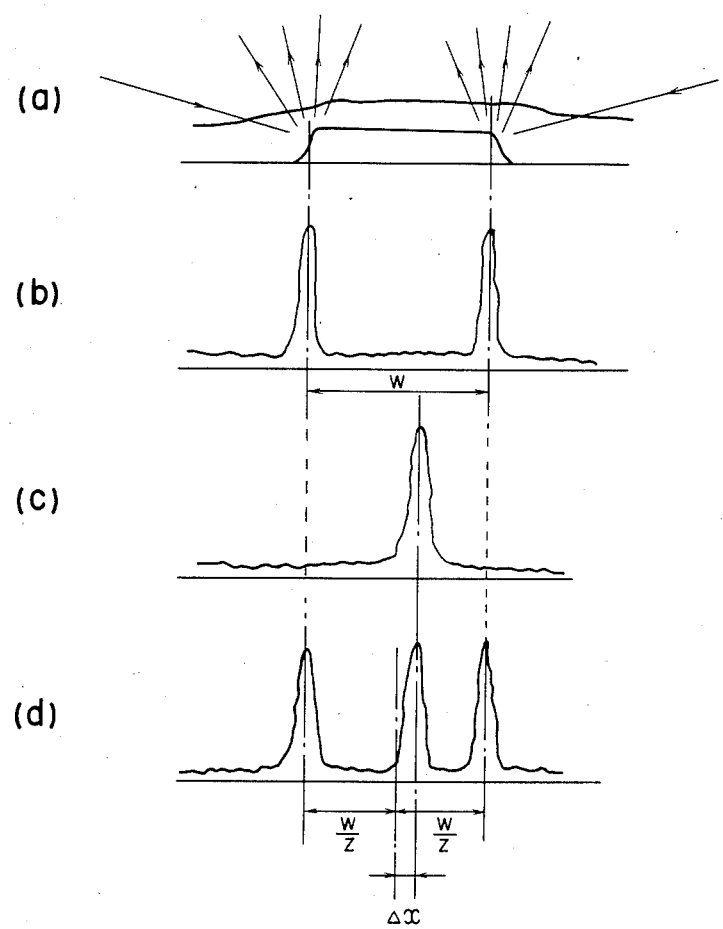
Figure 14A:
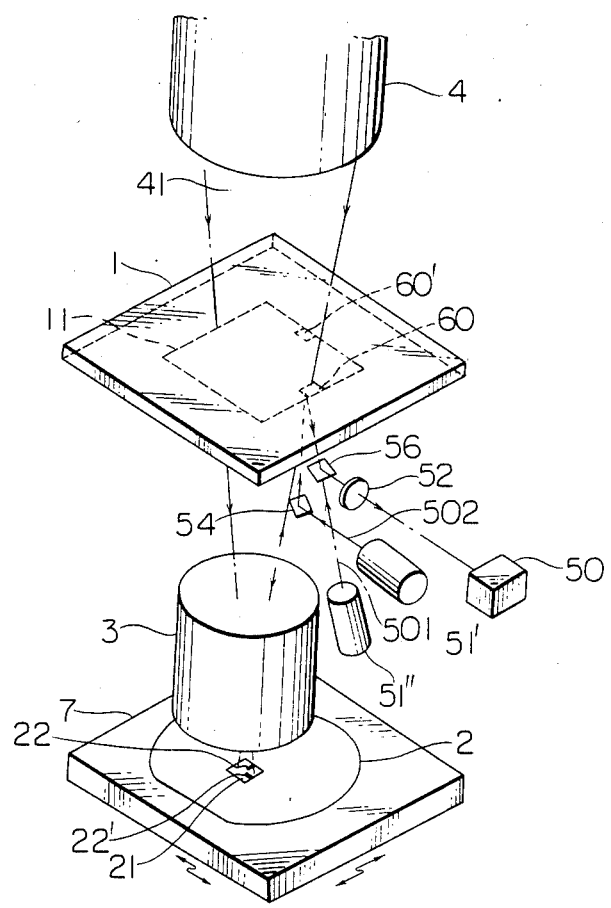
FIGS. 14A, 14B, 15A and 15B show exposure apparatuses and an alignment methods in accordance with other embodiments of the present invention.
Figure 15A:
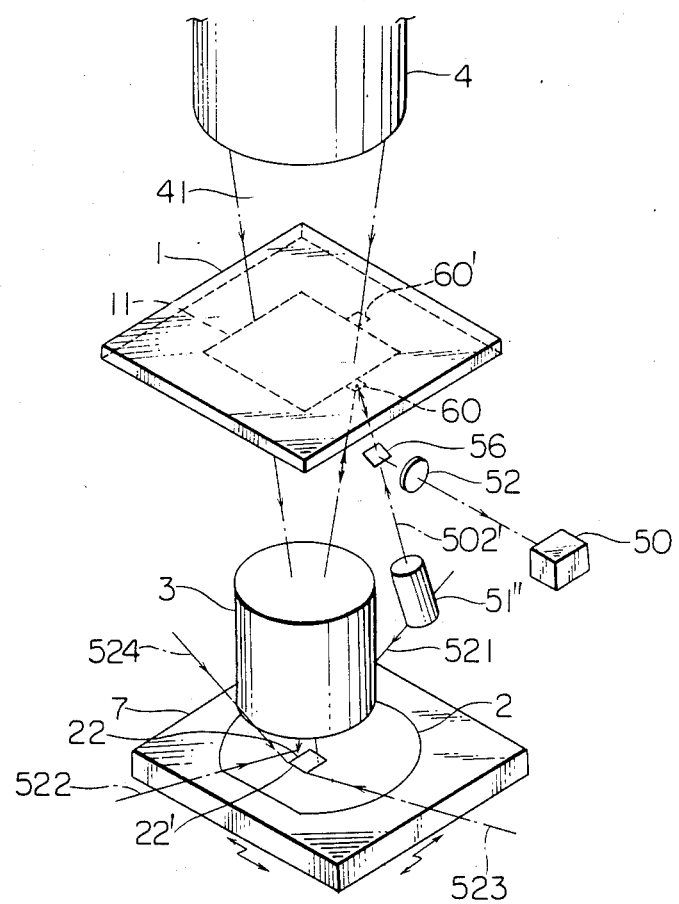

Referring to FIGS. 10A and 10B, a common principle to embodiments shown in FIGS. 10A, 14A and 15A is now explained. An alignment/reflection area section including focusing patterns 60 and 60' is formed in a scribe area or bonding areas 60 and 60' around an exposure pattern area section 11, in adjacent to the exposure pattern area section 11 on the mask 1. The focusing pattern may comprise hyperbolas as shown in Fig. llA or quasi-hyperbolas as shown in Fig. llB. The pattern comprises a number of hyperbolas or quasi-hyperbolas drawn by shifting a hyperbola or quasi-hyperbola having a width w in a direction x (direction of a line connecting two focal points of the hyperbola) with a pitch p. A black or hatched area represents a Cr surface and a white area represents a Cr-free glass surface. The Cr surface forms the reflection portion. Further, in FIG. 11B, the width w and the lengths $l_1$, $l_2$, $l_3$, . . . of the hatched strips are determined such that they form a group of quasi-hyperbolas which will approximate a group of ideal hyperbolas as much as possible that can be drawn with an electron beam lithography apparatus. When a monochromatic light 502 of a wavelength $\lambda$ is projected to this pattern at incident angle $\theta_0$ which is near to 90°, a reflected and diffracted light is condensed into a slit shape at a position 1122, as shown in FIG. 12A. On the other hand, the alignment mark 22 (or 22'), in FIG. 10A, in the scribe area on the wafer or the bonding area in the chip is obliquely illuminated by the e-lines 523 and 524 and the scattered light 503 is transmitted through the imaging lens 3 and the image is focused at the position P' in FIG. 9, directed to the alignment/reflection area section 60 along the light paths 503 and 503' of FIG. 12A, regularly reflected (without diffraction) and focused at the position 1122. Thus, as shown in FIG. 12B, the focusing pattern is formed such that the area 60 and the focusing position 1122 are spaced by $\Delta z$ from each other. FIG. 12C is a view looking in a normal direction of the drawing in FIG. 12B. FIG. 13 shows the slit-shaped condensed image (FIG. 13C) by the diffraction light from the alignment/reflection area section formed in the vicinity of the position 1122 and the image (FIG. 13b) formed by obliquely illuminating the chip 21, transmitting the light therefrom through the focusing lens 3 and regularly reflecting the light by the Cr surface of the alignment/reflection area section 60. As shown in FIGS. 13a and 13b, the image from the chip 21 includes two peaks because of the scattered light created by the edges of the mark 22 (22'). Since a mid-point of the two peaks is a center of the mark 22 (22'), $\Delta x$ determined in a manner shown in FIG. 13d represents a positional deviation of the pattern. Accordingly, the deviation is detected by focusing both images onto the alignment detector 50 shown in FIG. 10A by the mirror 53 and the enlarging focusing lens 52 through the light path 504 shown in FIGS. 10A and 10B so that an alignment control signal corresponding to the deviation is produced. The wafer 2 or the mask 1 is finely moved in accordance with the control signal so that the mask is perfectly aligned with the wafer. Generation of an alignment control signal and attainment of the alignment may be possible in the same manner as in FIG. 5A embodiment. Immediately after the aignment is detected, the exposure light (e.g. g-line) is emitted from the exposure light source means 4 so that the alignment and the exposure are carried out without a time lag and the total wafer exposure time is reduced.

To summarize the principle described above, when the exposure pattern area section on the mask is to be projected onto the surface of the semiconductor wafer which is the workpiece, the alignment/reflection area section having the focusing pattern is arranged on that surface of the mask which does not face the exposure light source, in adjacent to the exposure pattern area section, the image of the reflected diffraction light created by illuminating the focusing pattern with the monochromatic light is detected as the reticle alignment mark image, the image of the alignment mark on the workpiece formed by the scattered light transmitted through the exposure or projection lens is detected and the alignment of those images is attained by driving the means for moving the mask or wafer.

Figure 11A:
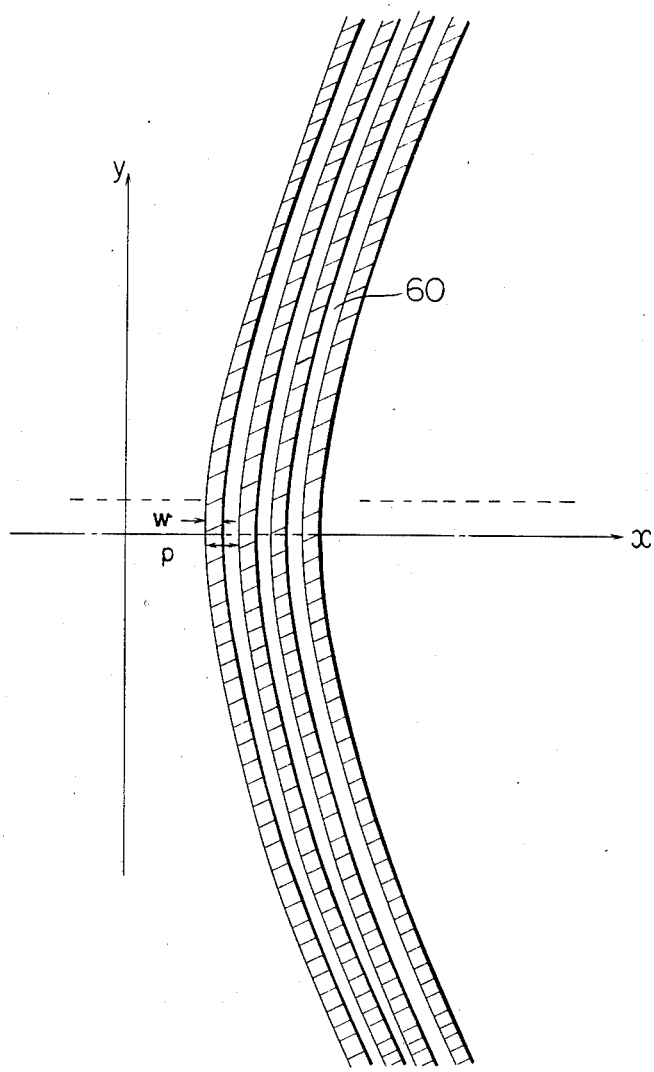
FIGS. 11A and 11B show an arrangement of the alignment/reflection area sections which may be used in the apparatus of FIG. 10A.

Referring again to FIGS. 10A and 10B, an embodiment will be explained. As shown in FIG. 10B, the mask (reticle) 1 has the exposure pattern area section including the area 11 and has the alignment/reflection area sections including areas 60 and 60' each carrying the focusing patterns, the alignment/reflection area sections being arranged on that surface of the mask 1 which does not face the exposure light source 4, at a position corresponding to the scribe area. The focusing pattern comprises hyperbolas or quasi-hyperbolas as shown in FIG. 11A or FIG. 11B. As shown in FIG. 12B, the hyperbolas are oriented such that they project toward the circuit pattern. The areas 60 and 61' may be rectangles having one side of 0.5-1 mm long and they are illuminated by a parallel beam of a He-Ne laser beam source 51 through a mirror 54 (Since the illumination and detection systems for the area 60' are identical to those for the area 60, they are not shown.) The He-Ne laser beam diffracted by the focusing pattern is condensed into a slit shape at the position 1122 shown in FIG. 10B. On the other hand, the chip 21 to be exposed is on the wafer on the movable wafer stage 7 and under the lens and at a position slightly deviated from the exact wafer position. The chip already has had the alignment mark formed in the scribe area, and if this mark aligns with the focusing pattern of the alignment/reflection area 60 of the mask, the mask pattern can be precisely overexposed on the chip. Thus, the alignment mark on the scribe area of the wafer 2 is focused at 1122 by obliquely illuminating the alignment mark by the He-Ne laser beams 521–524 in four directions, transmitting the lights scattered by the edges of the alignment mark through the focusing lens 3 and regularly reflecting the lights by the reflection portion of the area 60, that is, the Cr surface of the focusing pattern. The alignment mark image from the wafer formed at 1122 and the condensed image formed by the reflection and diffraction of the light from the mask are enlarged and focused on a detection plane (not shown) of the alignment detector 50 by the mirror 53 and the enlarging focusing lens 52 to determine the registration of both alignment mark images. The detection may be made by a solid-state imaging device or a combination of a scanning slit and a photo-multiplier. Misregistration of both patterns is detected and the control signal is generated. The wafer stage 7 or the mask 1 is moved in accordance with the control signal, and when the registration is attained, the exposure is carried out. Since the exposure light 41 is completely isolated from the alignment optical system and does not interfere, the exposure is completed immediately after the alignment.

Figure 14B:
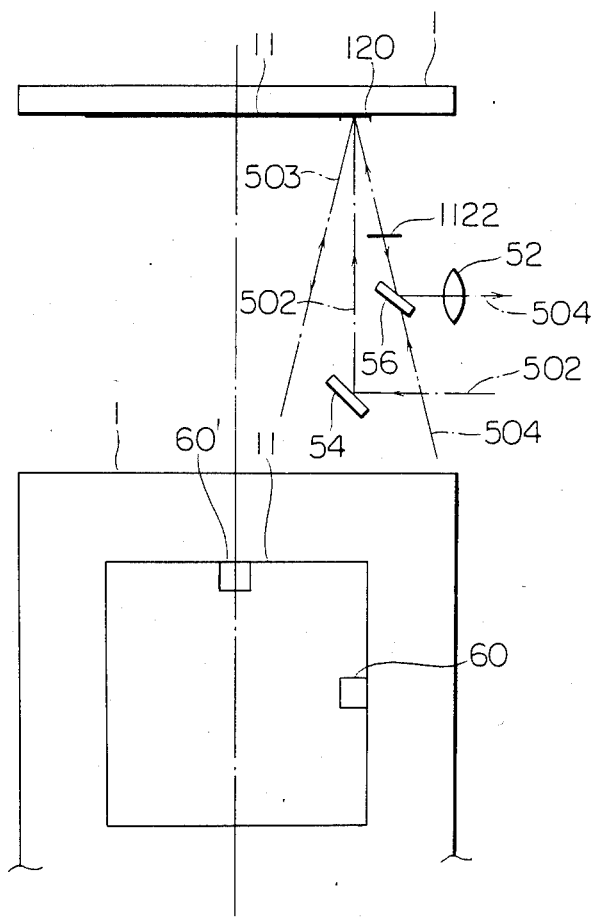

FIGS. 14A and 14B show another embodiment of the present invention. The like elements to those shown in FIGS. 10A and 10B are designated by the like numerals. In FIGS. 14A and 14B, the focusing patterns in the areas 60 and 60' of the alignment/reflection area sections adjacent to the exposure pattern area section including area 11 of the mask 1 are arranged at free locations in the bonding area in the exposure pattern area. The light from the e-line illumination light source 51" of the mercury lamp is transmitted through the semitransparent mirror 56 along the light path 501, regularly reflected by the reflection portion of the alignment/reflection area 60 including the focusing pattern such as that shown in FIGS. 11A and 11B, and transmitted through the focusing lens 3 to illuminate the alignment patterns 22 and 22' in the bonding area of the chip 21. The scattered (reflection) light again returns to the light path 503, again regularly reflected by the reflection portion of the area 60 and focused at 1122 (FIG. 14B). The mask position may be determined by directing the monochromatic light 502 emitted from the He-Ne laser beam source, an Ar laser beam source or the e-line light source 51' to the alignment/reflection area 60 through the mirror 54 and detecting the slit-shaped image at 1122 by the diffraction light from the focusing pattern. The detection of the alignment mark images of the mask 1 and the wafer 2 and the alignment control are identical to those described in the above embodiment.

Figure 15B:
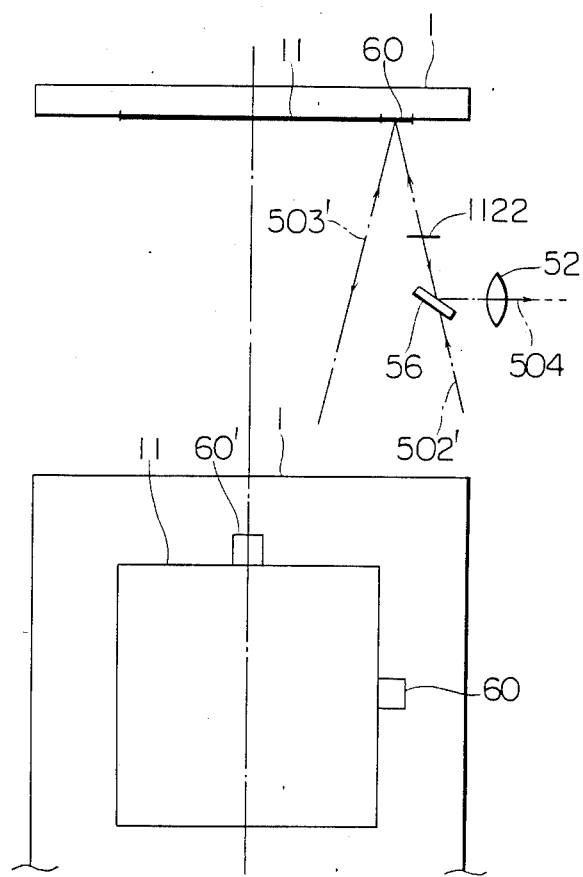

FIGS. 15A and 15B show another embodiment of the present invention. The like elements to those shown in FIGS. 10A and 10B are designated by the like numerals. The light emitted from the semiconductor laser 51" obliquely illuminates the alignment/reflection area 60 on the mask 1. Since the wavelength of the light is long, a primary diffraction angle is large and the primary diffracted light is returned in the incident direction and focused into a slit shape at position 1122. On the other hand, the light regularly reflected by the reflection portion of the area 60 including the pattern as shown in FIGS. 11A and 11B is transmitted along the light path 503' and used to illuminate the alignment mark in the scribe area of the wafer. The alignment mark of the wafer may be obliquely illuminated by the laser beams 521–524 in four directions, and the scattered light created by the step of the alignment mark of the wafer or the reflection light created by the illumination is regularly reflected by the reflection portion of the area 60 and focused at 1122 as may be done in the previous embodiment. The detection of the signals of the alignment mark images of the mask and the wafer and the alignment control are now explained.

In the embodiments shown in FIGS. 10A, 14A and 15A, it is desirable that the position corresponding to the alignment mark in the scribe area or the bonding area of the chip is not illuminated during the exposure step. Accordingly, it is desirable to arrange a blade for restricting the exposure area above the mask although it is not shown in the drawing of the embodiment.

Figure 16:
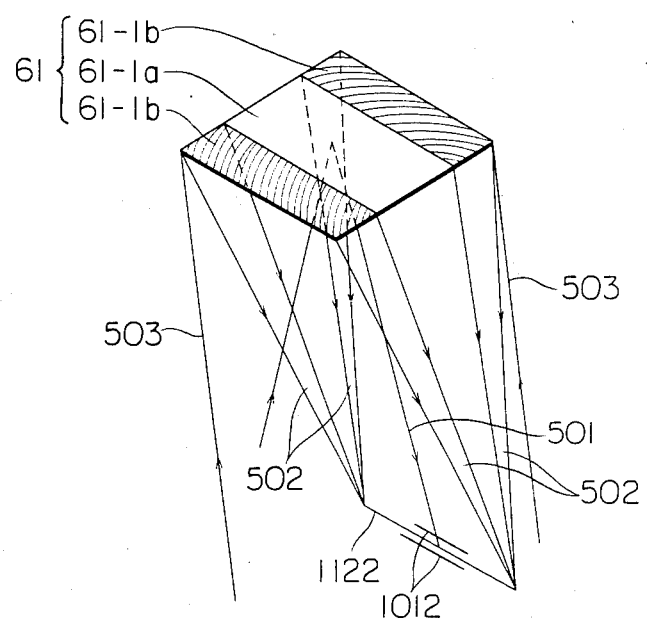
FIG. 16 shows an arrangement of the alignment/reflection area section for the apparatus of FIG. 5A when the alignment light having a different wavelength from the exposure light is used.

FIG. 16 shows another arrangement of the alignment/reflection area section formed on the mask. It is particularly suitable for use in the exposure apparatus shown in FIG. 5A although it may be used in the exposure apparatus shown in other drawings.

Figure 17A:
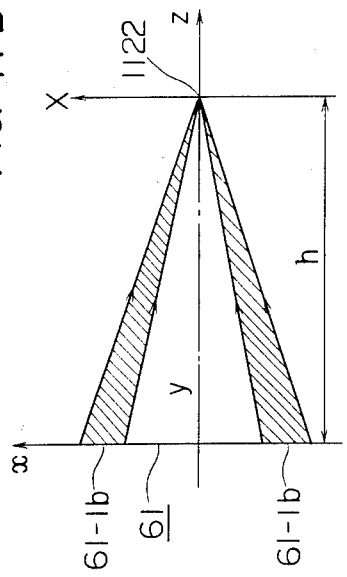

As shown in FIG. 17A, the alignment/reflection area section 61 has a reflection portion 61-1a at a center of the pattern and an alignment portions 61-1b including a focusing pattern at its side peripheries. The focusing pattern comprises a group of curves drawn by shifting a portion of a hyperbola in y-direction at a constant pitch, that is, a pattern of a group of hyperbolas. In order to form such a pattern on the mask, an electron beam lithography apparatus is usually used. When the pattern is fine, it is difficult to smoothly draw a curved pattern. Accordingly, small rectangles having sides along the x-direction and y-direction may be arranged to simulate the hyperbola.

The alignment/reflection area section 61 shown in FIG. 16 is arranged in the same manner as the alignment/reflection area 60 shown in FIG. 5A is arranged to align the wafer with the mask. However, the alignment light has a wavelength different from that of the exposure light, unlike in FIG. 5A embodiment. Referring again to FIG. 5A, the wafer alignment mark is illuminated by directing the laser illumination light 501' through the galvanomirror 53, the beam splitter 55, the focusing lens 52 and the mirror or beam splitter 51 to the reflection portion 61-1a (FIG. 16) at the center of the alignment/reflection area 61 on the reticle 1 so that the reflection light is transmitted through the reduction lens 3 and illuminates the wafer alignment mark 22 and the reflection light therefrom passes the same light path and is reflected by the area 61 to form the wafer alignment mark image 1012 as shown in FIG. 16. The position of the image formed is determined by the wavelength of the laser beam 501' used for the alignment and a chromatic aberration of the reduction lens 3. The surfaces of the mask (reticle) and the wafer are in the focusing relation for the exposure light by the reduction lens, but the image of the alignment mark on the wafer 2 is not formed on the area on the lower surface of the mask (reticle) 1 by the alignment detection light and it is reflected by the area 61 and focused at 1012 which is spaced from the lower surface of the mask by distance h. In the present embodiment, in order to detect the relative position of the wafer and the mask (reticle) by the wafer alignment mark image, the alignment/reflection area 61 has the center reflection portion 61-1a and the peripheral alignment mark portions 61-1b which contains the pattern of hyperbolas. When the laser illumination light 503 is irradiated to the pattern 61-1b, the linear image 1122 is formed at the position of the image of the wafer alignment mark. A shape of the hyperbolas and an intensity distribution of the linear image (change in the x-direction) for forming the linear image at the focusing positon of the wafer alignment mark (spaced from the lower surface of the reticle by h) are now explained with reference to FIGS. 17A–17C.

Figure 17B:
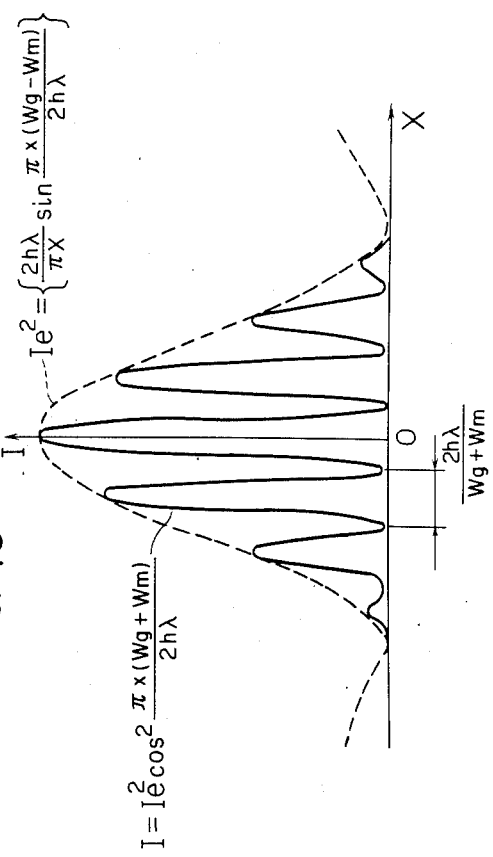
Figure 17B:
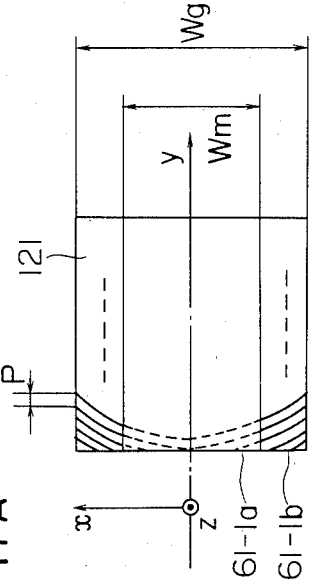

FIG. 17A shows the alignment/reflection area 61 on the reticle 1 and coordinates (x, y) exist on this plane. The mask alignment marks 61-1b which include the focusing patterns, that is, the hyperbola patterns (hyperbola gratings) are arranged on the opposite sides of the reflection portion 61-1a. Broken lines shown in the reflection portion 61-1a merely show connections of the left and right hyperbolas and they are not real patterns. FIGS. 17B and 17C are side views of FIG. 17A, and x-y coordinates and y-z coordinates exist on the respective planes. The incident laser beam is a collimated beam which is in the y-z plane, makes an angle $\theta_0$ with the z-axis, is reflected and diffracted by the pattern of hyperbolas arranged at a pitch p to form the linear pattern 1122 at the position spaced from the lower surface of the reticle by h. The optical axis of the diffraction light makes an angle $\theta_1$ with the z-axis. The pattern of hyperbolas is represented by the following formula.

$$y = \frac{1}{\sin\theta_0 + \sin\theta_1}\left( n\lambda - \frac{h}{\cos\theta_1} + \sqrt{x^2 + \frac{h^2}{\cos^2\theta_1}} \right) \quad (1)$$

where n is an integer. It is an aggregation of hyperbolas whose asymptotic curve is given by the following formula.

$$y = \frac{1}{\sin\theta_0 + \sin\theta_1}\left( n\lambda - \frac{h}{\cos\theta_1} \pm x \right)$$

The pitch p of the hyperbolas is given by $$p = \frac{\lambda}{\sin\theta_0 + \sin\theta_1}$$

This hyperbola grating (hyperbola pattern) does not exist in the reflection portion 61-1a as shown in FIG. 17A (broken lines) but exists in the alignment mark portions 61-1b on the opposite sides of the reflection area 61-1a. A width of the reflection portion 61-1a is represented by Wm and a total width of the hyperbola pattern (including the width of the reflection portion 61-1a) is represented by Wg. The width Wm should be at least a width of the illumination beam for the wafer alignment mark. If the reflection portion 61-1a is too narrow and the illumination beam illuminates the hyperbola pattern, the reflected diffraction light therefrom is superimposed on the wafer alignment mark and an S/N ratio of a detection signal for the wafer alignment mark is reduced. The width is approximately equal to a product of a diameter of an illumination area necessary to detect the wafer alignment mark and a reciprocal of a reduction factor of the reduction lens. When the collimated laser beam having the wavelength $\lambda$ is applied to the hyperbola pattern represented by the formula (1) having the width $W_g$ and the center blank portion $W_m$, at the incident angle $\theta_0$, the reflected diffraction beam forms the linear image extending along the y-axis at the position spaced from the mask surface by h, as shown in FIGS. 17B and 17C. An intensity distribution I(X) in the x-direction (coordinate on the linear image is X) is given by $$I(X) = I_c^2 \cos^2 \frac{\pi X(W_g W_m)}{2h\lambda}$$

where $$I_c = C\frac{2h}{\pi X}\sin\frac{\pi X(W_g - W_m)}{2h\lambda}$$

C is a constant proportional to a laser beam intensity and a reflection factor.

Figure 18:
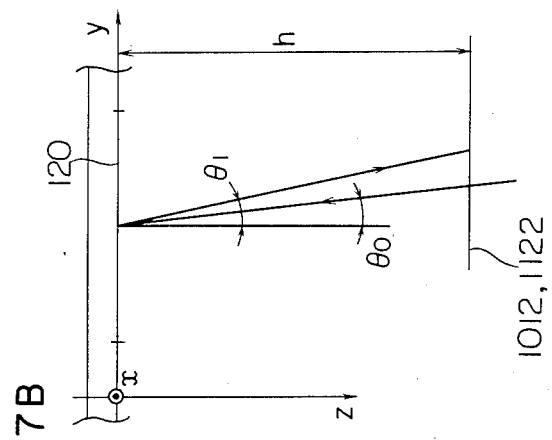

It is a pattern of a square of cosine waves having zero phase at a center of the pattern and having an envelope represented by $I_c^2$ as shown by a broken line in FIG. 18. Because the linear pattern has a symmetric fine structure, the center of the pattern can be precisely determined so that the position of the mask can be precisely determined. As described above, this pattern is formed on the same focusing plane (h below the reticle surface) as that of the wafer alignment mark image formed by illuminating the wafer alignment mark by the laser beam and enlarging the image by the reduction lens (after the reflection by the reflection portion of the alignment/reflection area). Accordingly, as shown in FIG. 5A, it can be detected by the same detection system as that for the wafer alignment mark, by using the solid-state array device 50 through the mirror 51, focusing lens 52 and beam splitter 55. Accordingly, a drift of the detection position with time is zero as compared with a case where the marks are detected by two separate detection optical systems, and the optical system can be simplified and rendered inexpensive. The wafer target alignment mark and the diffraction image of the hyperbola pattern representing the reticle position are time-serially detected by the same detection system. As shown in FIG. 5A, the wafer 2 is moved by the array pitch of the chip by the x-y movable stage (wafer table) 7 so that an unexposed chip is brought under the reduction lens. The wafer alignment mark illumination laser beam 501' first illuminates the wafer alignment mark 22 so that the position thereof is detected by the solid-state array device 50. Then, the laser beam 501' is extinguished and the illumination light 503 illuminates the alignment/reflection area (hyperbola pattern) on the reticle so that the reticle position is detected by the solid-state array device 50. A relative deviation is determined based on the two detected positons and it is compensated by finely adjusting the reticle 1 by the reticle (mask) fine adjusting mechanism 130. Since the distance of fine adjustment is the product of the reciprocal of the reduction factor of the reduction lens and the distance of the relative movement of the wafer 2, precise positioning is attained as compared to a case where the wafer 2 is moved. Since the positions of the wafer and the mask are time-serially detected, both detection patterns can be independently detected and the S/N ratio is not lowered by the other pattern. Thus, high precision detection is attained.

As shown in FIGS. 17A to 17C, the collimated laser beam is irradiated to the alignment/reflection area 61 at the incident angle $\theta_0$ when the reticle position is to be detected, but the light normally reflected by the area 61 is transmitted through the reduction lens 3 and illuminates the wafer alignment mark. As a result, the wafer alignment mark image may be superimposed on the diffraction linear image of the hyperbola pattern. This does not pose a substantial problem when the intensity of the diffraction linear image is high, but the influence of the superposition on the alignment precision cannot be neglected if the intensity of the reflection image of the wafer alignment mark is high or an extremely high alignment precision is required.

A resolution to this problem is discussed below.

The width $W_m$ of the reflection portion 61-1a of the area 61 shown in FIGS. 17A to 17C is selected to a minimum required to illuminate the wafer alignment mark, and the width $W_g$ is selected to $$\frac{W_g/2}{\sqrt{h^2 + (W_g/2)^2}} \geqq 0.7 \sin^{-1} NA$$

where NA is the numerical aperture of the detection optical system. In this manner, $W_g - W_m$ is selected to be large. As a result, a peak of the intensity of the hyperbola grating diffraction image (FIG. 18) is proportional to $(W_g - W_m)^2$ and the reduction of the S/N ratio due to the superposition of the wafer pattern image is avoided.

In a second solution, the reticle pattern of FIG. 16 does not use the conventional Cr mask but uses the $Cr_2O_3$ mask. A reflection factor $r_{cr}$ of the Cr mask for the wavelength $\lambda = 500$ nm is approximately 60% while a reflection factor $r_{cr2O3}$ of the $Cr_2O_3$ mask is approximately 16%. The intensity $I_w$ of the wafer alignment mark image is proportional to $r^2$ because the light is reflected twice in the illumination and the imaging. On the other hand, the intensity $I_m$ of the hyperbola pattern diffraction image representing the reticle position is proportional to r because the diffraction image is obtained by one reflection by the mask. Accordingly, a ratio of the intensity of the mask alignment mark diffraction image and the intensity of the wafer alignment mark image (noise image in detecting the mask alignment mark diffraction image), that is, the S/N ratio is given by $$S/N \propto I_m/I_w$$
$$\propto 1/r$$

Accordingly, the smaller the mask reflection factor is, the higher is the S/N ratio. The S/N ratio when the $Cr_2O_3$ mask is used is approximately four times as large as that when the Cr mask is used. Other low reflection factor materials than $Cr_2O_3$ may be used to attain the same effect. The effect will be satisfactory if the S/N ratio is at least three times as high as that obtained when the Cr mask is used.

A third solution is shown in FIGS. 19A-19C. If the laser beam is irradiated only to the hyperbola pattern 61-1b on the opposite sides of the reflection portion 61-1a of the alignment/reflection area 61 and not irradiated to the wafer alignment mark 22, the wafer alignment mark image is not superimposed as the noise. As shown in FIGS. 19A-19C, a restrictive illumination mask 540 is inserted in the light path of the collimated illumination light beam 503 so that only the alignment mark portion 61-1b of the area 61 on the reticle 1. As shown in FIG. 19B, the mask 540 transmits the light in the area (openings) corresponding to the hyperbola pattern area and blocks the light in other areas. The collimated light transmitted through the restrictive illumination mask passes through lenses 541 and 542 and illuminates only the hyperbola pattern 61-1b of the area 61 on the reticle 1. FIG. 19C illustrates how the area 61 in FIG. 19A is illuminated by the light 503 masked by the mask 540. As can be seen, only the alignment portions 61-1b carrying hyperbolic patterns receive light 5401' representative of the images of the openings 5401. With this arrangement, since the reflection portion 61-1a is not illuminated, the intensity of light undesirably reaching the wafer alignment mark is so small that the reticle position can be detected with a high signal-to-noise ratio.

A fourth solution is described below. The focusing position of the wafer alignment mark image and the position of the diffraction image of the hyperbola pattern representing the reticle position are intentionally shifted from each other on the focusing plane. The amount of shift depends on the alignment precision in the step-and-repeat process of the wafer table and is to be larger than the line width of the wafer alignment mark. The mark or pattern is formed such that the wafer alignment mark and the diffraction image of the hyperbola pattern representing the reticle position are relatively shifted from each other by the above shift amount. Alternatively, the illumination light for the hyperbola pattern may be slightly shifted from the right angle by an angle made thereby with the x-axis as shown in FIGS. 17A and 17C.

In the above embodiments, when the exposure pattern is to be projected to the wafer, the g-line, e-line and d-line which are spectrum lines of the mercury lamp or the He-Ne laser beam is used to align the patterns of the mask and the wafer. Such a light is irradiated through the exposure focusing lens. Since the exposure focusing lens is usually designed to exhibit a best focusing characteristic (high resolution power) only to the monochromatic light such as g-line, the spectrum width of the illumination light other than the exposure light must be narrow. However, for the light other than the exposure light, the focusing position on the optical axis varies significantly even for a slight change of the wavelength. Accordingly, in order to attain the alignment detection pattern with a high resolution, it is necessary to use the light of as narrow spectrum width as possible. However, the light source other than the laser, such as the mercury lamp cannot produce a light having a sufficiently narrow spectrum width and a sufficient intensity to allow the detection of the alignment mark on the wafer. Accordingly, it is advantageous to use the laser beam as the alignment light source from the standpoints of intensity and resolution. However, since the laser beam usually has a high coherence (spatial coherence), if the alignment mark on the wafer is marked by granular material such as Al or WSi, a noise called a speckle pattern is included in the mark image detection signal and the S/N ratio of the detection signal is lowered. By multiple interference created between the surface of the resist layer coated on the wafer to be aligned and the alignment mark or the underlying layer carrying the alignment mark, a fine variation of the thickness of the resist layer may appear as a noise so that the S/N ratio of the detection signal is lowered.

Figure 20A:
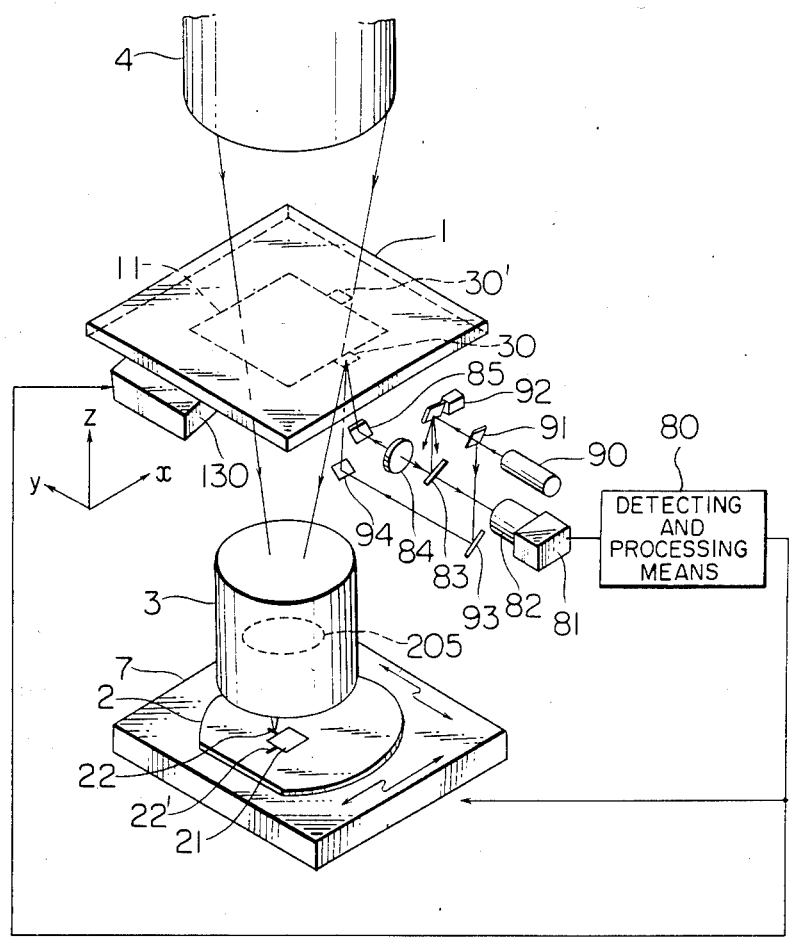
FIGS. 20A, 20B and 21 show exposure apparatuses and alignment methods in accordance with other embodiments of the present invention in which the exposure light and the alignment light have different wavelengths.
Figure 20B:
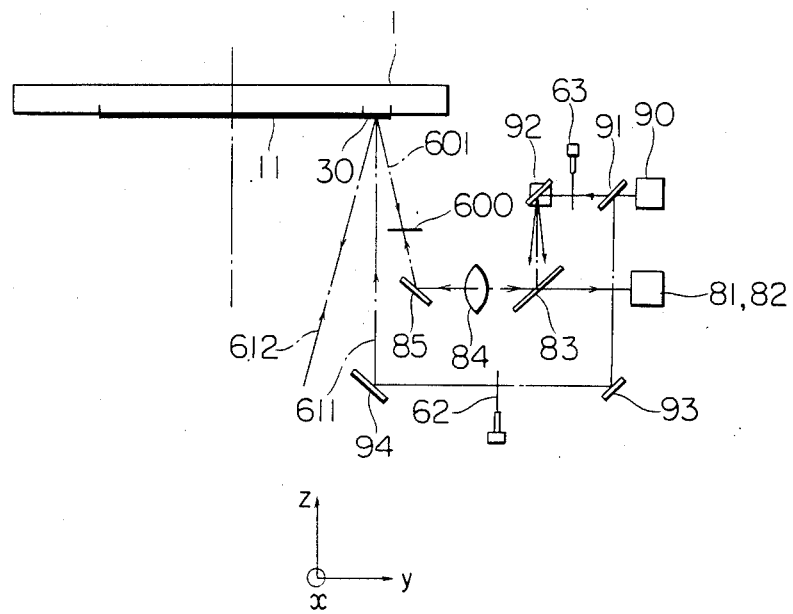

Referring to FIGS. 20A and 20B, an exposure apparatus and an alignment method according to an embodiment of the present invention which suppresses the speckle pattern noise and the multiple interference will be explained. The alignment light has a wavelength different from that of the exposure light.

Figure 21:
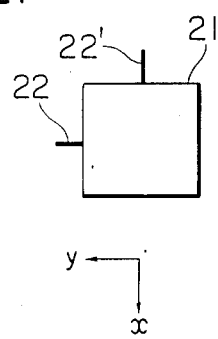
Figure 22A:
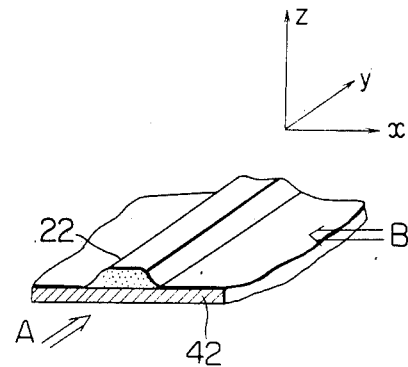
FIGS. 22A to 22C, 23A and 23B show an incident angle of the alignment light to a wafer alignment mark and an incident light to a projection lens from the wafer alignment mark.
Figure 22B:
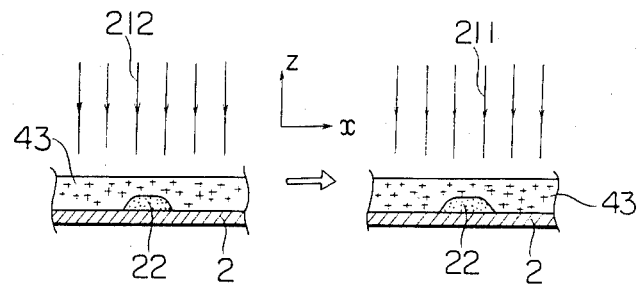
Figure 22C:
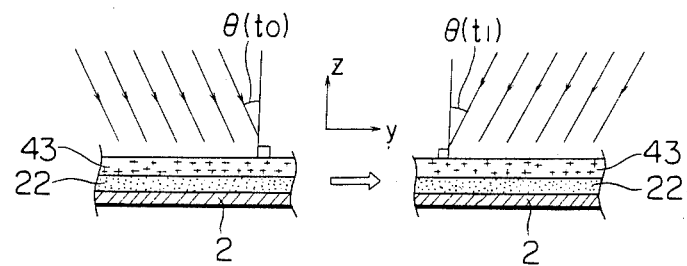

Alignment/reflection area sections including areas 30 and 30' on the mask (reticle) 1 may contain the focusing patterns shown in FIGS. 10A, 10B, 11A, 11B, 12A-12C and 13 and may be arranged on the mask 1 in the manner shown in those figures. Numeral 4 denotes an exposure light source. The light emitted from the laser beam source 90 is split by the beam splitter 91. One of the split beams illuminates the alignment/reflection area 30 containing the hyperbola pattern. The illumination light is diffracted and a primary diffraction light passes through a light path 601 and focused into a linear image at 600. The direction (x-direction) of the linear image represents the x-direction of the reticle 1. The other of the split beams is deflected by a Galvanomirror 92 which is an incident angle varying means. The deflected beam passes through a semitransparent mirror 83, a lens 84 and a mirror 85 and is directed to the alignment/reflection area 30 adjacent to the exposure pattern area 11 of the mask (reticle) 1, and the normally reflected light therefrom is directed into an entrance pupil 205 of the exposure focusing lens 3. The light 612 transmitted through the entrance pupil illuminates the alignment mark 22 (22') on the wafer arranged in the periphery of the chip 21 on the wafer 2. The chip 21 on the wafer 2 includes the elongated alignment marks 22 and 22' extending in the y-direction and the x-direction as shown in FIG. 21. In FIGS. 20A and 20B, only a control unit including an optical system for aligning the alignment mark 30 on the reticle 1 with the alignment mark 22 on the wafer 1 is shown as the alignment optical system, and another control unit including an optical system for aligning the mark 30' with the mark 22' is omitted because it may be identical. The laser beam directed to the alignment mark 22 on the wafer 1 in FIGS. 20A and 20B has no change of incident angle in the x-z plane (x-direction) normal to the lengthwise direction of the alignment mark as shown in FIG. 22B, but the incident angle changes in the y-z plane (y-direction) normal to the mask 1 or the wafer 2 as shown in FIG. 22C. FIG. 22B shows a view of the alignment mark 22 on the wafer 2 (underlying layer of the alignment mark) as viewed in a direction A shown in FIG. 22A, and FIG. 22C is a view as viewed in a direction B. Numeral 43 in FIGS. 22B and 22C denotes a resist film coated on the wafer 2.

Figure 23A:
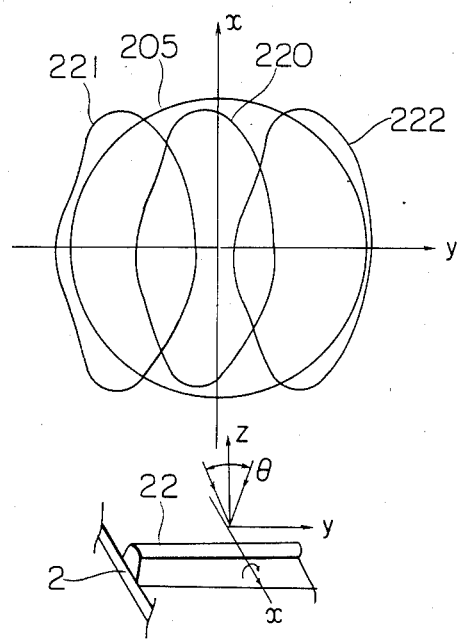
Figure 23B:
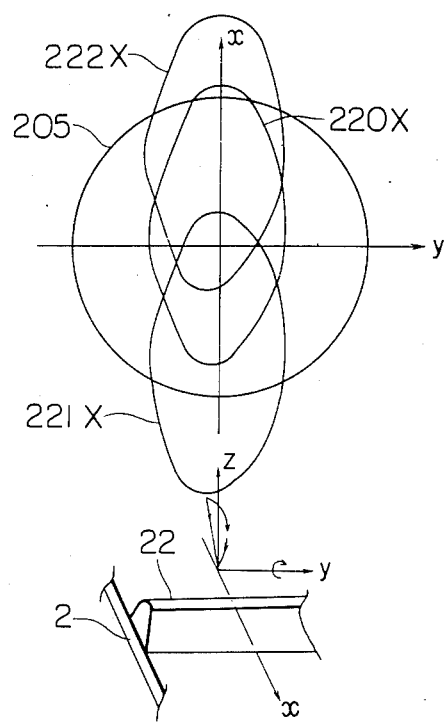

The light including the position information of the alignment mark 22 reflected by the wafer 2 is usually a diffraction pattern spreading in a direction (x-direction) normal to the lengthwise direction (y-direction) of the alignment mark on the wafer 1, as shown by 220, 221 and 222 in FIG. 23A, on the entrance pupil 205 of the exposure focusing lens 3 (x-y plane parallel to the mask 1 or the wafer 2). Accordingly, by deflecting the incident angle to the y-direction (normal to the x-axis) in the y-z plane as shown in FIG. 22C, the diffraction light information, particularly the position information of the pattern to be detected (x-coordinate for the alignment mark 22 and y-coordinate for the mark 22') can be detected without loss. For comparison purpose, FIG. 23B shows the light deflected in the normal direction (x-direction in the z-x plane). In this case, the information in the direction to be detected is lost. The incident light is deflected in the direction shown in FIGS. 22A-22C and 23A, reflected by the wafer 2, again passes through the entrance pupil 205 of the focusing lens 3, normally reflected by the reflection portion of the alignment/reflection area 30 on the reticle 1 and the image of the alignment mark of the wafer is focused at 600 at which the linear image of the diffraction light from the reticle is focused (reticle alignment mark image). The reticle alignment mark image and the wafer alignment mark image are transmitted through the mirror 85, lens 84 and beam splitter 83 and refocused on the imaging plane of the imaging means 81 by the focusing optical system 82.

The noise superimposed on the wafer alignment mark and the suppression of the noise are now explained. The wafer alignment mark image $\overline{22}$ and the mask alignment mark image $\overline{30}$ focused on the imaging plane of the imaging means 81 are shown in FIG. 25, in which numeral 600 denotes the imaging plane, numeral 30 denotes the image of the reticle window 30, and numeral $\overline{22}$ denotes the image of the alignment mark 22 of the wafer 2. When a two-dimensional array solid-state imaging device is used as the imaging means 81, a light intensity $I_t(i, j)$ is detected at time t for an address (i, j) of the array pixels. The detection signals in the longitudinal direction of the alignment mark 22 are summed.

$$O(t, i) = \sum_{j=j_s}^{j_e} I_t(i, j)$$

so that the signals are averaged and the S/N ratio is improved. When the alignment mark of the wafer 2 is marked by granular material such as aluminum, the S/N ratio of the detection signal is still low even after the averaging as shown in FIGS. 26A and 26B, in which the incident angles of the illumination light are fixed at different angles. As shown in FIG. 24, the incident angle $\theta$ is changed from time to time in the plane described above. During the change of the incident angle $(t_o - t_N)$, the image information is accumulated. Consequently, the detection signal in the i-direction $O_\Sigma(i)$ is now represented by the following expression:

$$O_\Sigma(i) = \int_{t_o}^{t_N} O(t, i) dt.$$

Since the accumulation is usually done in the conventional imaging means, no special means is required. An image read-in period $T_1$ (normally 16 ms) and a deflection period $T_2$ by the Galvanomirror meet a relation of $T_1 = n_o T_2$ (where $n_o$ is an integer). Thus, the information in FIGS. 26A, 26B, . . . are averaged and a high S/N signal as shown in FIG. 26C is produced. Accordingly, the alignment mark difficult to detect, such as the aluminum alignment mark can be detected.

FIGS. 27A-27C show other modes of changing the incident angle to the wafer alignment mark. In FIG. 27A, the incident angle is set by a step function, and in FIGS. 27B and 27C, the incident angles are fixed depending on the alignment marks.

FIGS. 28A and 28B illustrate the illumination of the alignment mark in the multiple interference environment. When the multiple interference occurs between the resist surface 43 and the alignment mark 22 or the underlying layer 2, the interference intensity is determined by an optical path difference $\Delta l = 2nd\cos\theta$ of the layer and a complex index of refraction of the resist, alignment mark or underlying layer. Normally, it periodically changes with the film thickness d as shown in FIG. 29 ($\lambda = 514$ nm). When an average resist layer thickness dm is 1.6 $\mu$m$\pm$0.14 $\mu$m, the interference intensity significantly changes ($\Delta O_{\theta=0°}$) at $\theta = 0°$. When $\theta = 13°$, the interference intensity changes with d as shown by a broken line and the change is small ($\Delta O_{\theta=13°}$). At the edge of the wafer alignment mark, the signal intensity changes as shown in FIGS. 30A, 30B and 30C (which show the intensities detected in the x-direction when the resist layer thickness changes only depending on the shape of the underlying layer and is symmetric, or changes in accordance with the edge of the pattern). The signal $\Delta O$ is superimposed as the noise on the signals of FIGS. 30A-30C so that misdetection of the edge may occur when $\Delta O$ is large. By adjusting the incident angle to an optimum angle, the detection with a high S/N is attained.

In FIG. 31, $I_R$ denotes the reticle alignment mark image and $I_W$ denotes the wafer alignment mark image. A deviation between the centers of those signal waveforms is detected by the detection system 80 and the wafer table 7 is moved in the x-direction (and also in the y-direction) to compensate for such deviation. As shown in FIG. 20B (not shown in FIG. 20A), shutters 62 and 63 are inserted in the respective light paths to detect the lights separately so that the centers of the signals $I_R$ and $I_W$ can be detected without error. Generation of the alignment control signal and alignment may be attained in the same manner as described with reference to FIG. 5A embodiment.

Figure 32:
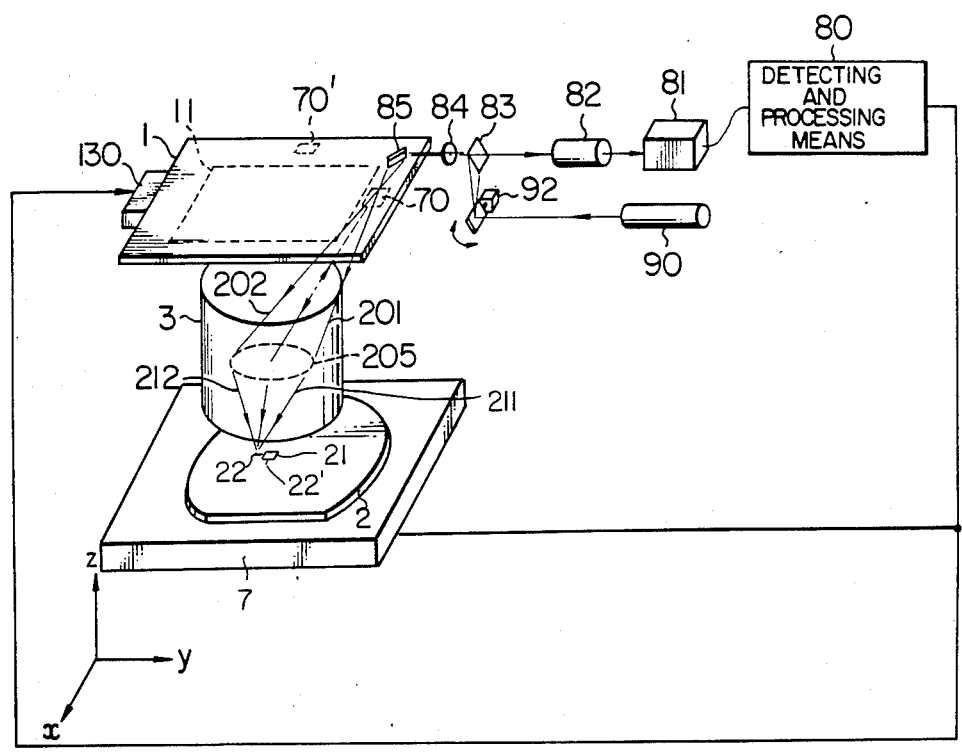
FIG. 32 shows an exposure apparatus and an alignment method in accordance with another embodiment of the present invention, in which the alignment light has substantially the same wavelength as that of the exposure light.

Referring next to FIG. 32 showing an exposure apparatus and an alignment method according to the present invention, in which the speckle pattern noise and multiple interference are suppressed, the same reference numerals as used in FIG. 20A represent similar elements or members. Laser light from a laser light source 90 having a wavelength substantially equal to that of exposure light for projecting circuit patterns (on the exposure area 11) is adapted for deflection by a Galvanomirror 92. The light under deflection passes a semitransparent mirror 83 and a lens 84 and is reflected by a mirror 85 so as to pass through a window 70 serving as a mask alignment mark and forms light 201 (or light 202 depending on the deflection by the Galvanomirror 92) entering the entrance pupil of the exposure lens 3. The light having passed through the entrance pupil now forms light 211 (or light 212 depending on the deflection by the Galvanomirror 92) illuminating the wafer alignment mark 22 (22') provided in the vicinity of the chip 21 of the wafer 2'. The wafer alignment marks 22 and 22' are of an elongated or slender shape and extend in the y-direction and x-direction, in the same manner as shown in FIG. 21. In FIG. 32, only a control unit including an optical system for aligning the alignment mark 70 on the reticle 1 with the alignment mark 22 on the wafer 1 is shown as the alignment optical system, and another control unit including an optical system for aligning the mark 70' with the mark 22' is omitted because it may be identical. Further, deflection of the laser light illuminating the wafer alignment marks to change the angle of incidence of the light on the wafer alignment marks, detection of reflection images of wafer alignment marks and of reticle alignment marks, generation of the alignment control signal and attainment of the alignment by the use of the control signal may be made in the same manner described in connection with FIGS. 20A to 31 above.

In the embodiments described hereinbefore, use is made of a two-dimensional imager means such as a solid-state camera to detect images of wafer alignment marks and reticle alignment marks. However, since these images carry only one-dimensional information, detection of these images is possible at a high speed and with a high resolution by the provision of a cylindrical lens before the imager means for compressing the lengthwise information of the images of the elongated or slender alignment marks and by the use of a one-dimensional array of imaging elements (e.g. CCD) for the imager means. The cylindrical lens and one-dimensional array may be, e.g., those disclosed in printed Japanese Publications, Japanese Patent Publication No. 29045/83 or 53217/81.

As described hereinabove, in accordance with the present embodiment, the alignment mark on the wafer is illuminated by the laser beam having the narrow spectrum width so that the defocusing due to the chromatic aberration of the exposure focusing lens is minimized and the level of the detection signal is kept sufficiently high. Further, the incident angle of the laser beam can be controlled to an optimum angle in accordance with the semiconductor process such as the material of the resist layer, the thickness thereof, the shape of the underlying layer and the material thereof so that the noise due to the coherence of the laser beam is substantially reduced. Accordingly, the stability of the detection of the alignment pattern is significantly improved.

We claim:

1. An exposure apparatus comprising:

first light source means;

mask plate means having an exposure pattern area section and an alignment/reflection area section adjacent to said exposure area section, said alignment/reflection area section including a reflection portion and a mask alignment mark portion and disposed on that surface of said mask plate means which does not face said first light source means, said mask plate means being arranged so that said exposure pattern area is illuminated by said first light source means;

movable stage means for holding thereon a workpiece having a workpiece alignment mark;

projection lens means interposed between said mask plate means and said movable stage means and disposed across said mask plate means from said first light source means so that said exposure pattern area section, when illuminated, is projected through said projection lens onto said workpiece;

alignment means for detecting the positional relation between said mask alignment mark portion of said alignment/reflection area section in said mask plate means and said workpiece alignment mark of said workpiece on said movable stage means and producing a control signal for achieving alignment of said mask alignment mark portion with said workpiece alignment mark, said alignment means including (a) second light source means arranged with respect to said mask plate means such that light from said second light source means is directed to illuminate said workpiece alignment mark so that the resulting reflected light from said workpiece alignment mark is directed through said projection lens means to said alignment/reflection area section and is reflected at its reflection portion to provide a reflection image of said workpiece alignment mark, and (b) a detecting means for detecting said reflection image of said workpiece alignment mark and an image of the mask alignment mark portion of said alignment/reflection area to produce said control signal; and means for adjusting relative position between said mask plate means and said workpiece, said adjusting means being adapted to be responsive to said control signal.

2. An apparatus according to claim 1, in which the wavelength of light from said second light source means is substantially equal to that of light from said first light source means, and said alignment/reflection area section has a predetermined contour.

3. An apparatus according to claim 2, in which said alignment/reflection area section includes a grating constituting said mask alignment mark portion.

4. An apparatus according to claim 2, in which said contour of said alignment/reflection area section constitutes said mask alignment mark portion.

5. An apparatus according to claim 1, in which the wavelength of light from said second light source means is different from that of said first light source means, and said alignment/reflection area section includes a group of substantially hyperbolic lines for forming a diffraction image representative of said mask alignment mark portion.

6. An apparatus according to claim 5, in which said group of hyperbolic lines are oriented to project toward said exposure mask pattern area section in said mask plate means.

7. An apparatus according to claim 1, in which the wavelength of light from said second light source means is different from that of said first light source means, said mask alignment mark portion consists of first and second alignment sub-portions with said reflective portion being interposed therebetween, said first and second alignment sub-portions carrying parts of a group of hyperbolic lines for providing, when illuminated, an image representative of said mask alignment mark portion.

8. An apparatus according to claim 1, in which said alignment means further includes (c) means optically coupled with said second light source means for changing the incident angle of light illuminating said workpiece alignment mark in a plane perpendicular to said workpiece and parallel with the lengthwise direction of said workpiece alignment mark, and said detecting means including means for accumulating reflected light from said workpiece alignment mark received via said reflection portion of said alignment/reflection area section.

9. An apparatus according to claim 1, in which said second light source means is positioned so that light from said second light source means is able to illuminate said workpiece alignment mark obliquely without passing said projection lens means.

10. An apparatus according to claim 1, in which said second light source means is positioned so that light from said second light source means is first directed to said alignment/reflection area section to be reflected at the reflective portion of said alignment/reflection area section and to be directed through said projection lens means to said workpiece alignment mark to thereby illuminate said workpiece alignment mark.

11. A method of aligning an exposure mask plate with a workpiece having a workpiece alignment mark in an exposure apparatus in which the exposure mask plate is illuminated by first light source means to project images of patterns contained in an exposure pattern area section of the exposure mask plate through projection lens means onto the workpiece, the workpiece being held on movable stage means, the method comprising the steps of:

arranging an alignment/reflection area section adjacent to said exposure pattern area section on that surface of said exposure mask plate which does not face said first light source means, said alignment/reflection area section including a reflective portion and an alignment mark portion;

illuminating said workpiece alignment mark with second light source means so that reflected light from said workpiece alignment mark passes through said projection lens means and is reflected at said reflective portion of said alignment/reflection area section;

detecting the positional relation between said alignment mark portion and said workpiece alignment mark and producing a control signal representative of misregistration between said alignment mark portion and said workpiece alignment mark derived from the detected positional relation; and adjusting the relative position between said exposure mask plate and said workpiece in accordance with said control signal.

12. A method according to claim 11, in which during the step of illuminating said workpiece alignment mark, the incident angle of light illuminating said workpiece alignment mark is varied in a plane perpendicular to said exposure mask and parallel with the lengthwise direction of said workpiece alignment mark.

13. A method according to claim 11, in which light for illuminating said workpiece alignment mark is caused to pass through said projection lens means.

14. A method according to claim 11, in which light for illuminating said workpiece alignment mark is directed to said workpiece alignment mark without passing through said projection lens means.

15. A method of aligning the positional relation between a mask and a workpiece through a projection lens for projecting a circuit pattern on the mask to the workpiece by projecting light, comprising the steps of:

providing a mask alignment mark adjacent to said circuit pattern on that surface of said mask which faces said projection lens, said mask alignment mark including a reflection portion and an alignment mark portion, said alignment mark portion forming a grating pattern;

forming a reflecting and deflecting image obtained by illuminating a substantially monochromatic light to said grating pattern;

providing a workpiece alignment mark on the workpiece;

forming a workpiece alignment mark image obtained by passing the reflected light from said workpiece alignment mark through said projection lens and reflecting at said reflection portion of mask alignment mark;

converting said reflecting and deflecting image and workpiece alignment mark image to the image signals by a detecting means; and aligning the positional relation between the mask and the workpiece according to said image signals.

16. A method according to claim 15, in which said substantially monochromatic light has a different wavelength from said projecting light.

17. A method according to claim 15, in which said grating pattern is formed by a group of substantially hyperbolic lines.

18. A method according to claim 15, further comprising the step of deforming said workpiece alignment mark, the incident angle of light illuminating said workpiece alignment mark through the projection lens is varied in a plane perpendicular to said mask and parallel with the lengthwise direction of said workpiece alignment mark.

19. A projection alignment apparatus for projecting the circuit pattern on a mask to a workpiece through a projection lens comprising:
   (a) a light element arranged such that light from a light source means is directed to illuminate a workpiece alignment mark, said mask including an alignment/reflection area formed adjacent to said circuit pattern on that surface of said mask which faces said projection lens, said alignment/reflection area having a reflective portion, so that light emanating from said workpiece alignment mark in response to the illumination of said workpiece is directed through said projection lens to said alignment/reflection area and is reflected at said reflective portion to provide a reflection image of said workpiece alignment mark;
   (b) a detecting mens for detecting said reflection image of said workpiece alignment mark and a reflecting and deflecting image obtained by illuminating a substantially monochromatic light to said mask alignment/reflection area said mask alignment reflection area including a grating pattern to produce an alignment signal; and
   (c) aligning means for aligning relative position between said mask and workpiece in accordance with said alignment signal.

20. A projection alignment apparatus for projecting the circuit pattern on a mask to a workpiece through a projection lens comprising:
   (a) illuminating means for directing a laser beam so that the incident angle of light illuminating a workpiece alignment mark through the projection lens is varied in a plane perpendicular to said workpiece and parallel with the lengthwise direction of said workpiece alignment mark;
   (b) detecting means for detecting said workpiece alignment mark by a workpiece alignment mark image signal constituted by an accumulation of picture elements of reflected images from said workpiece alignment mark through the projection lens and for detecting an image reflected from a mask alignment mark to produce a mask alignment mark image signal; and
   (c) means for aligning said mask and workpiece in accordance with said image signals.

21. A projection alignment apparatus according to claim 20, in which said accumulation is processed in accordance with the following expression $$O_\Sigma(i) = \int_{t_o}^{t_n} O(t, i) dt$$

where
   $O_\Sigma(i)$: workpiece alignment mark image signal for i-th column on the image plane of a reflected image, and
   $t_o$, $t_n$: start and end time points of a variation of the incident angle of the illuminating light.

22. A projection alignment apparatus according to claim 20, in which each of said reflected image $O(t,i)$ is formed in accordance with the following expression $$O(t, i) = \sum_{j=j_s}^{j_e} I_t(i, j)$$

where
   $I_t(i, j)$: light intensity of a reflected image at time t for address (i, j) of one picture element on an image plane of the reflected image, and
   $j_s$, $j_e$: start and end addresses for summation on image plane.

* * * * *